(12) United States Patent
Kawauchi et al.

(10) Patent No.: US 11,664,782 B2
(45) Date of Patent: May 30, 2023

(54) VIBRATOR ELEMENT AND VIBRATOR DEVICE

(71) Applicant: SEIKO EPSON CORPORATION, Tokyo (JP)

(72) Inventors: Osamu Kawauchi, Shiojiri (JP); Masashi Shimura, Chino (JP); Shogo Sasaki, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 163 days.

(21) Appl. No.: 17/160,882

(22) Filed: Jan. 28, 2021

(65) Prior Publication Data

US 2021/0242856 A1 Aug. 5, 2021

(30) Foreign Application Priority Data

Jan. 30, 2020 (JP) .............................. JP2020-014101

(51) Int. Cl.
*H03H 9/13* (2006.01)
*H03H 3/04* (2006.01)
*H03H 9/05* (2006.01)
*H03H 9/19* (2006.01)
*H03H 9/10* (2006.01)
*H03H 3/02* (2006.01)

(52) U.S. Cl.
CPC .............. *H03H 9/132* (2013.01); *H03H 3/04* (2013.01); *H03H 9/0557* (2013.01); *H03H 9/1021* (2013.01); *H03H 9/19* (2013.01); *H03H 2003/022* (2013.01); *H03H 2003/0428* (2013.01)

(58) Field of Classification Search
CPC .... H03H 9/132; H03H 9/0557; H03H 9/1021; H03H 9/19; H03H 9/0547; H03H 9/215; H03H 3/04; H03H 2003/022; H03H 2003/0428; H03H 2003/026
See application file for complete search history.

(56) References Cited

U.S. PATENT DOCUMENTS

2009/0160295 A1 6/2009 Iwatate et al.
2016/0344362 A1* 11/2016 Kobayashi ............... H03H 9/21

FOREIGN PATENT DOCUMENTS

| JP | 2009-171553 | 7/2009 |
|----|-------------|--------|
| JP | 2009-200648 | 9/2009 |
| JP | 2009-232376 | 10/2009 |

* cited by examiner

*Primary Examiner* — Jeffrey M Shin
(74) *Attorney, Agent, or Firm* — Rankin, Hill & Clark LLP

(57) ABSTRACT

The vibrator element includes a base part, a vibrating arm extending from the base part, and a weight provided to the vibrating arm, wherein the weight includes a thick film part, a thin film part thinner in film thickness than the thick film part, and a connection part which is located between the thick film part and the thin film part to connect the thick film part and the thin film part to each other, and which forms a taper shape gradually decreasing in film thickness in a direction from the thick film part side toward the thin film part.

11 Claims, 20 Drawing Sheets

FIG. 14
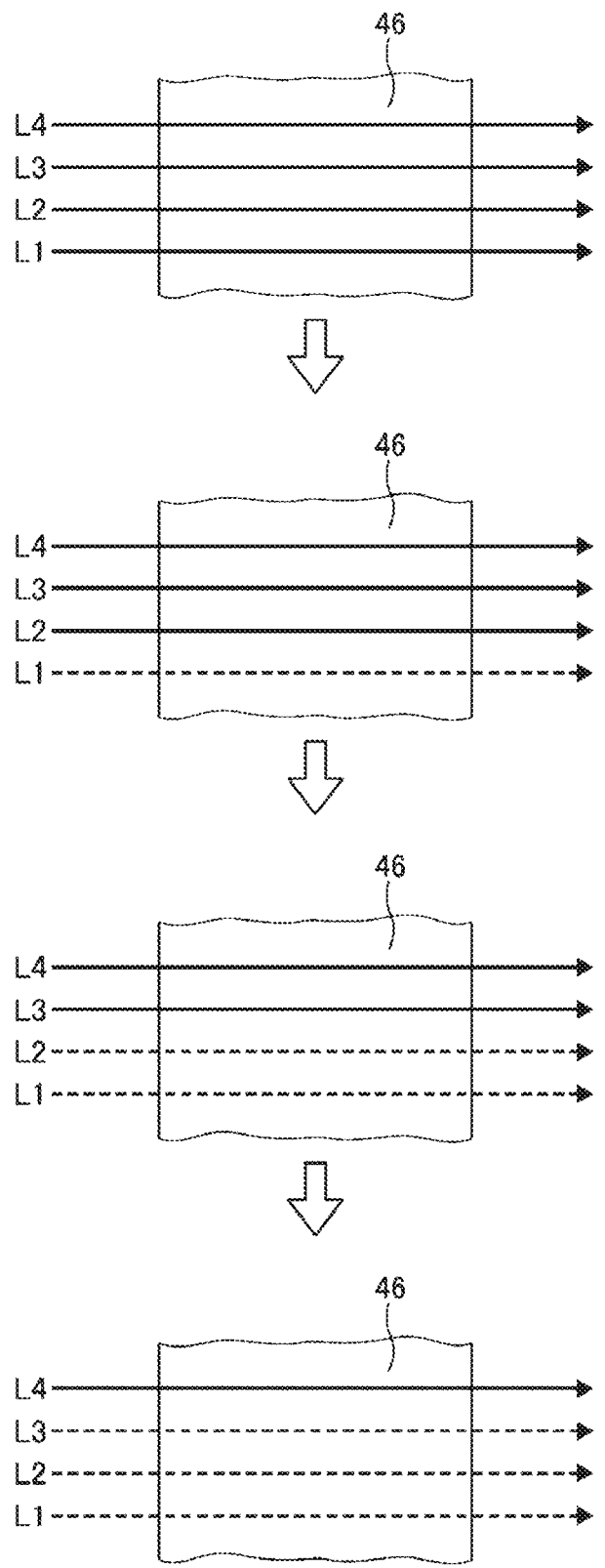
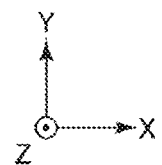

VIBRATOR ELEMENT AND VIBRATOR DEVICE

The present application is based on, and claims priority from JP Application Serial Number 2020-014101, filed Jan. 30, 2020, the disclosure of which is hereby incorporated by reference herein in its entirety.

BACKGROUND

1. Technical Field

The present disclosure relates to an vibrator element and a vibrator device.

2. Related Art

A tuning-fork vibrator described in, for example, JP-A-2009-232376 (Document 1) has a metal film provided to a tip part of a vibrating arm. In such a tuning-fork vibrator, by irradiating the metal film with a laser beam to remove a part of the metal film, it is possible to adjust a resonance frequency.

However, in the tuning-fork vibrator in Document 1, there is formed a step having a surface perpendicular to the metal film in the state in which the resonance frequency has been adjusted. Therefore, it becomes easy for the metal film to be separated from a vibrating arm starting from this step. When the metal film is separated, the mass of the vibrating arm varies, and thus, there is a possibility that the frequency of the tuning-fork vibrator changes.

SUMMARY

A vibrating element according to the present application example includes a base part, a vibrating arm extending from the base part, and a weight provided to the vibrating arm, wherein the weight includes a thick film part, a thin film part thinner in film thickness than the thick film part, and a connection part which is located between the thick film part and the thin film part to connect the thick film part and the thin film part to each other, and which forms a taper shape gradually decreasing in film thickness in a direction from the thick film part side toward the thin film part.

BRIEF DESCRIPTION OF THE DRAWINGS

FIG. 14 is a plan view for explaining the method of manufacturing the vibrator device shown in FIG. 1.

DESCRIPTION OF EXEMPLARY EMBODIMENTS

Hereinafter, a vibrator element, a vibrator device, an electronic apparatus, and a vehicle according to the present disclosure will be described in detail based on some embodiments shown in the accompanying drawings.

First Embodiment

Figure 1:
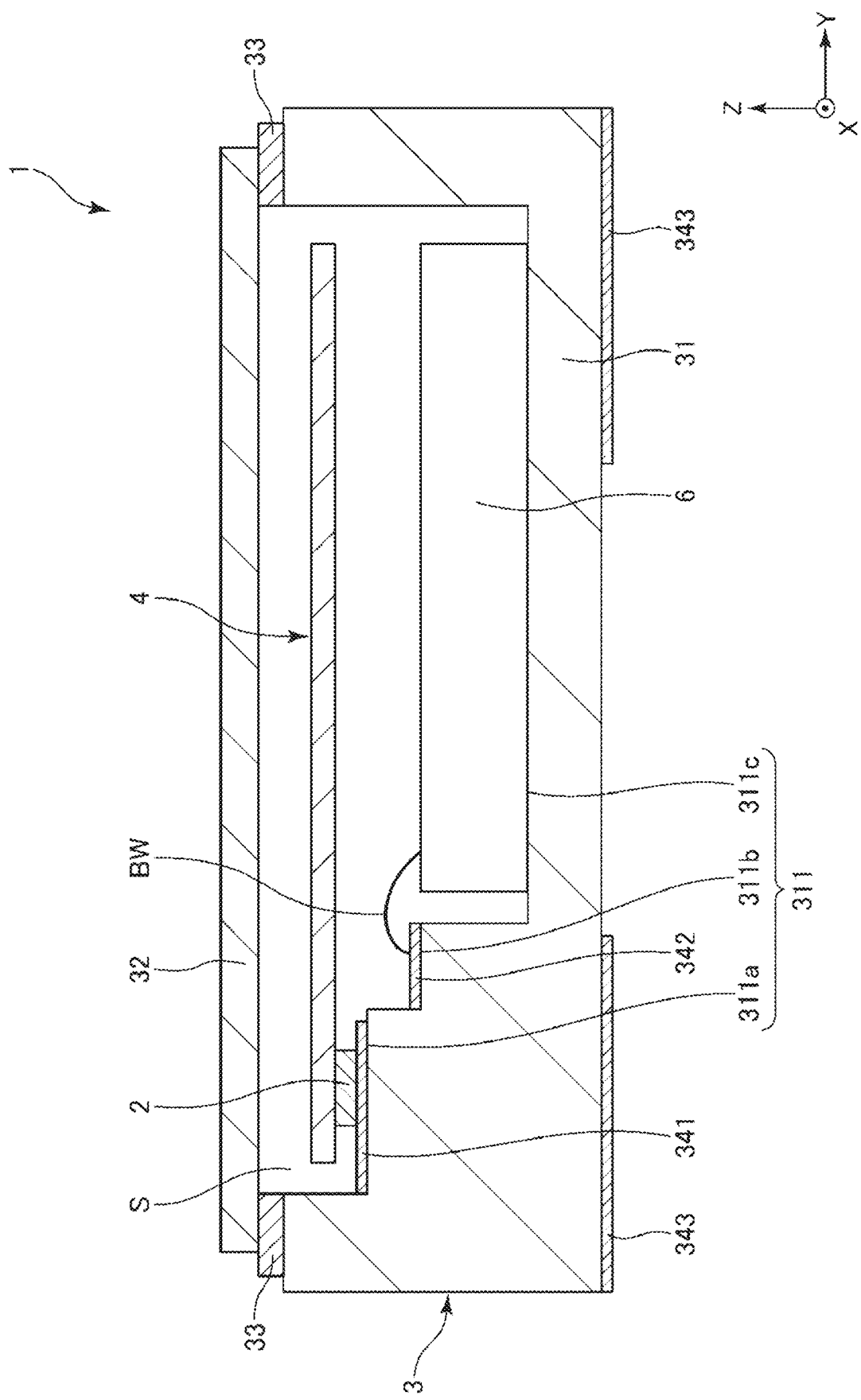
FIG. 1 is a cross-sectional view showing a vibrator device according to a first embodiment of the present disclosure.
Figure 2:
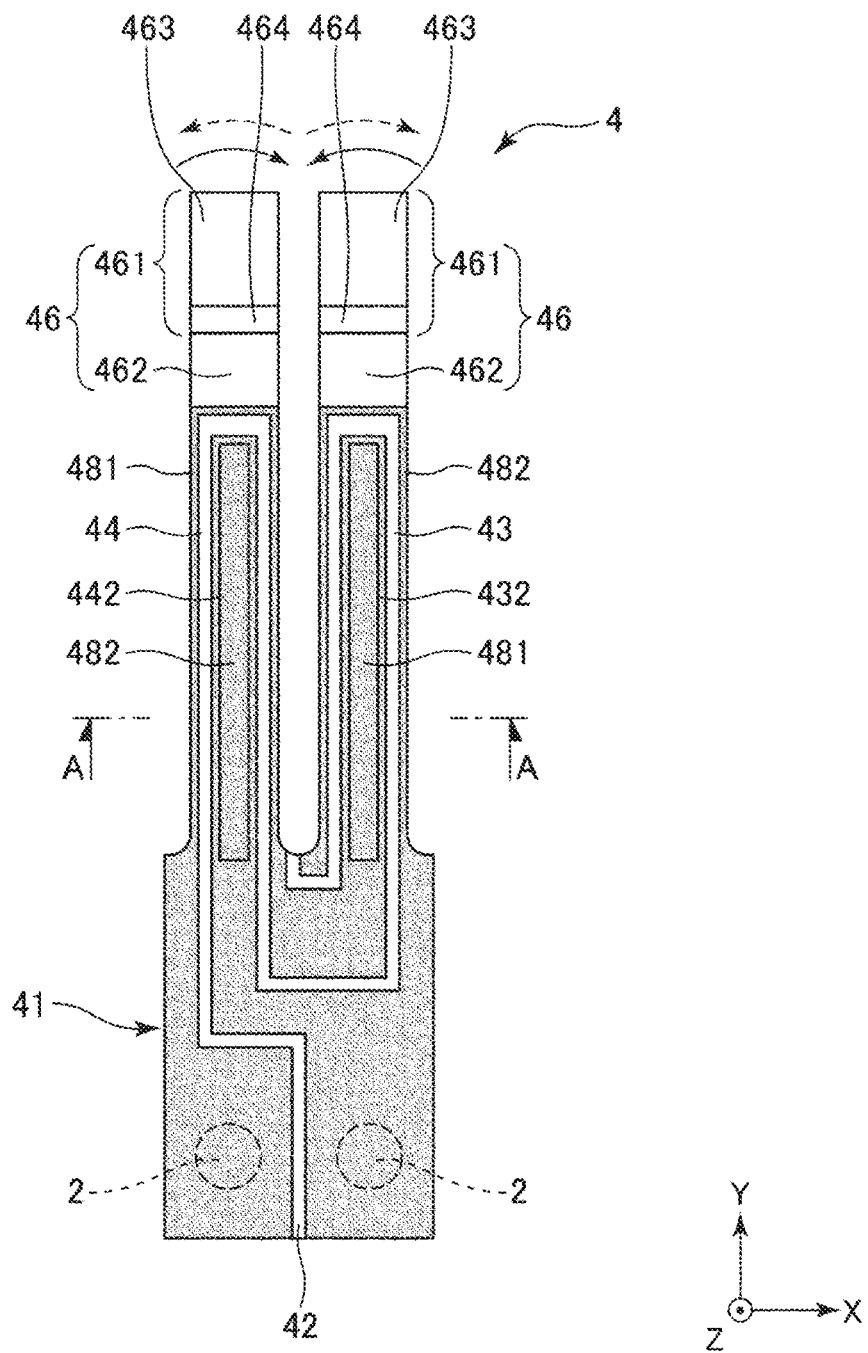
FIG. 2 is a plan view showing a vibrator element provided to the vibrator device shown in FIG. 1.
Figure 3:
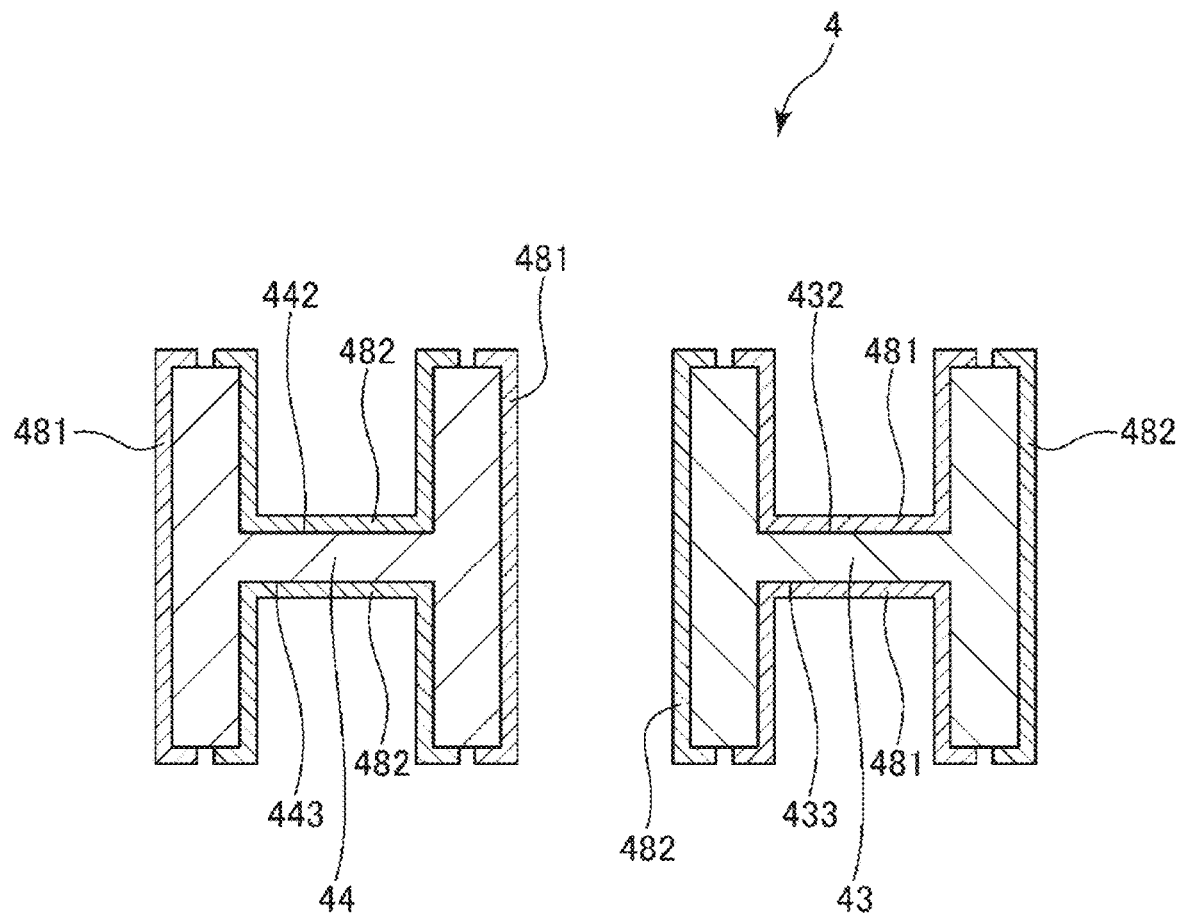
FIG. 3 is a cross-sectional view along the line A-A in FIG. 2.
Figure 4:
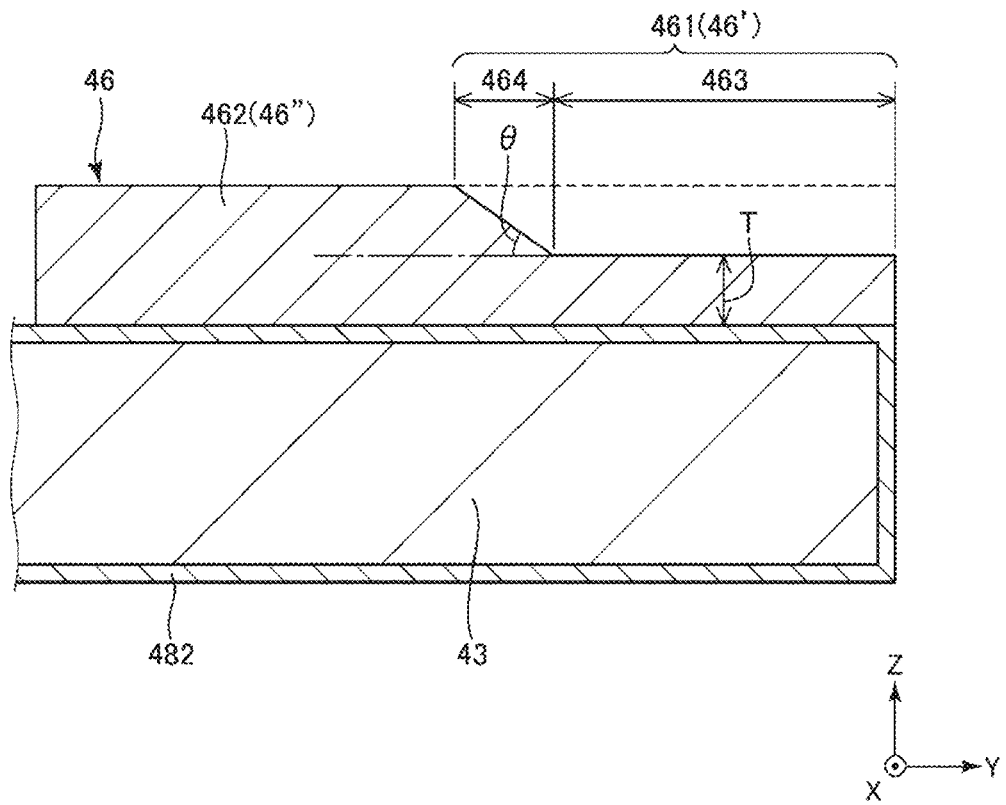
FIG. 4 is a cross-sectional view showing a weight provided to the vibrator element shown in FIG. 2.
Figure 5:
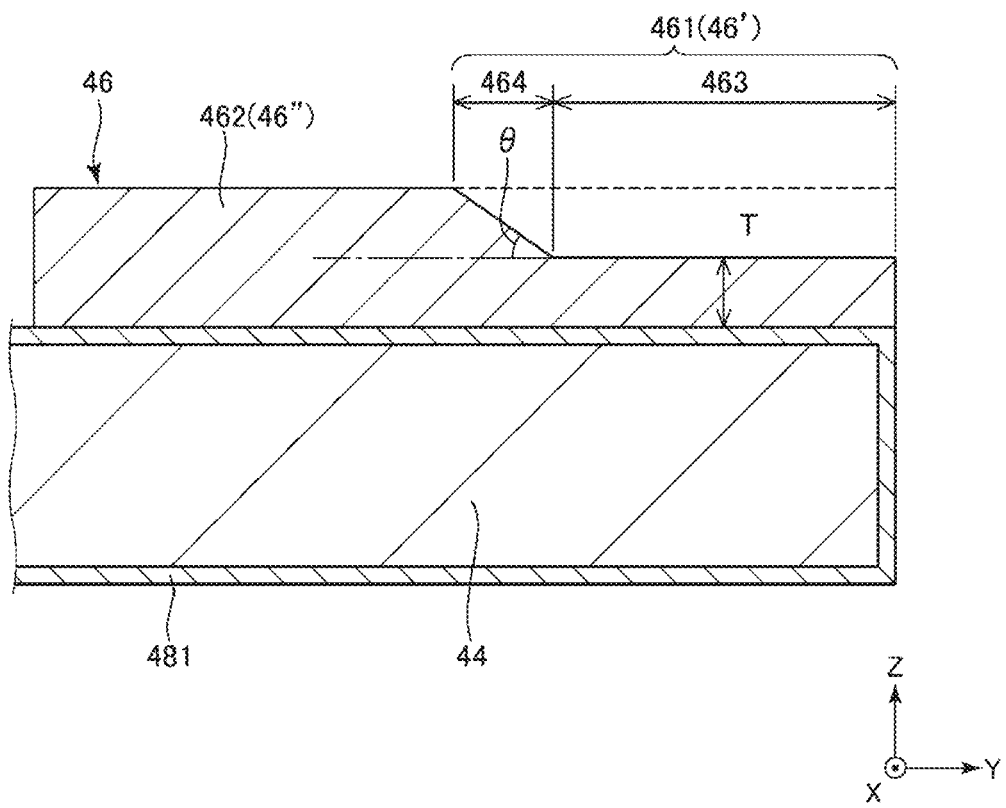
FIG. 5 is a cross-sectional view showing a weight provided to the vibrator element shown in FIG. 2.
Figure 6:
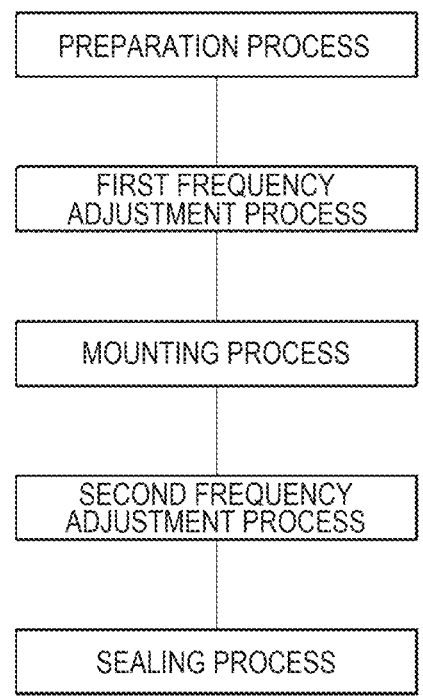
FIG. 6 is a diagram showing a manufacturing process of the vibrator device shown in FIG. 1.
Figure 7:
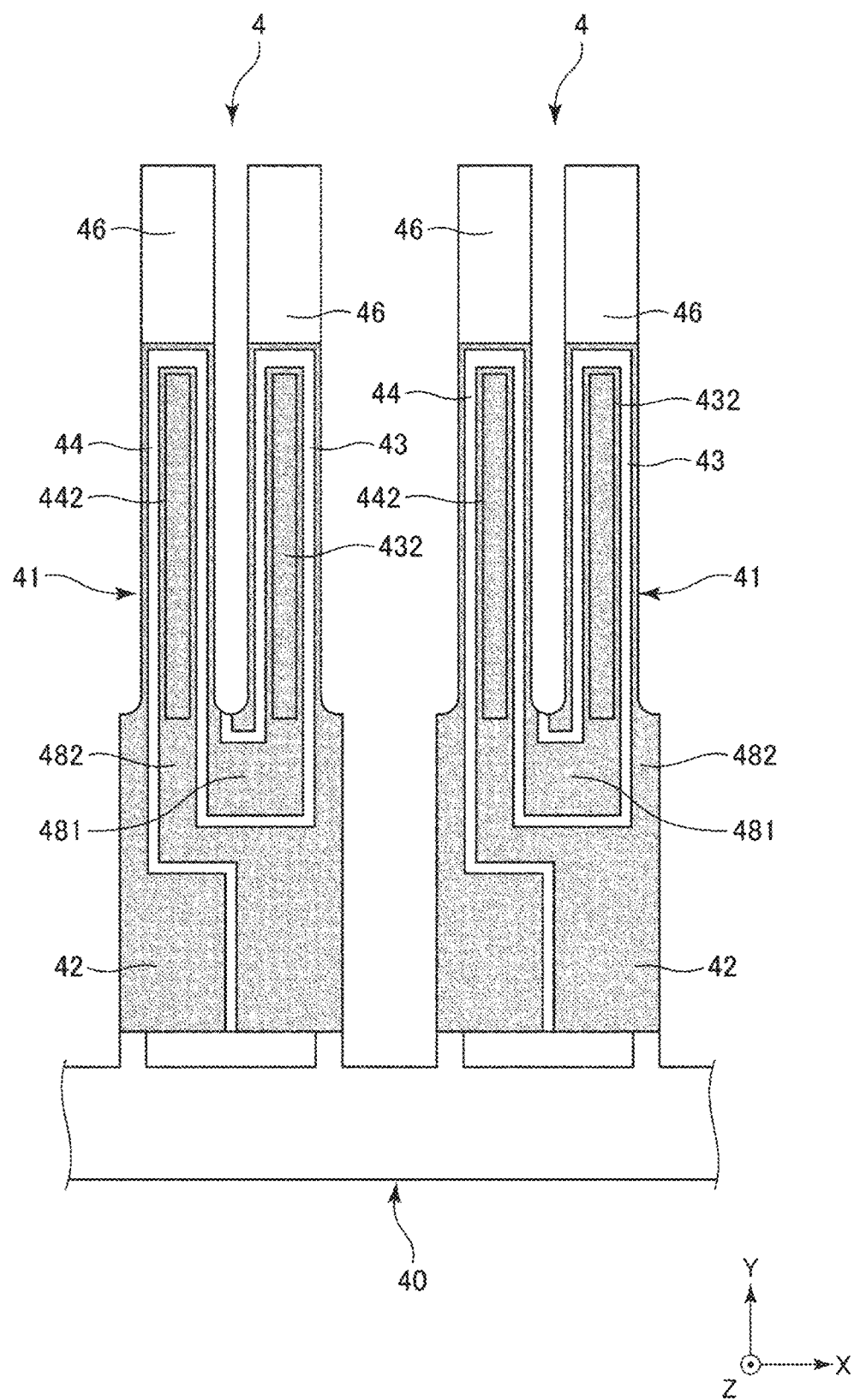
FIG. 7 is a plan view for explaining the method of manufacturing the vibrator device shown in FIG. 1.
Figure 8:
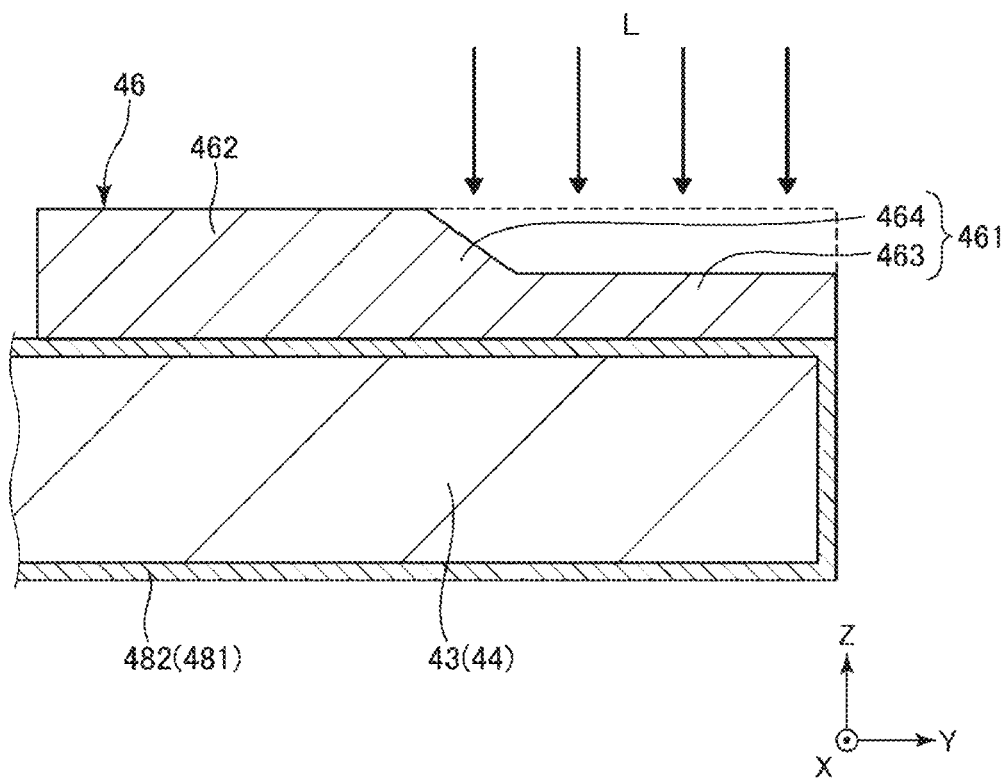
FIG. 8 is a cross-sectional view for explaining the method of manufacturing the vibrator device shown in FIG. 1.
Figure 9:
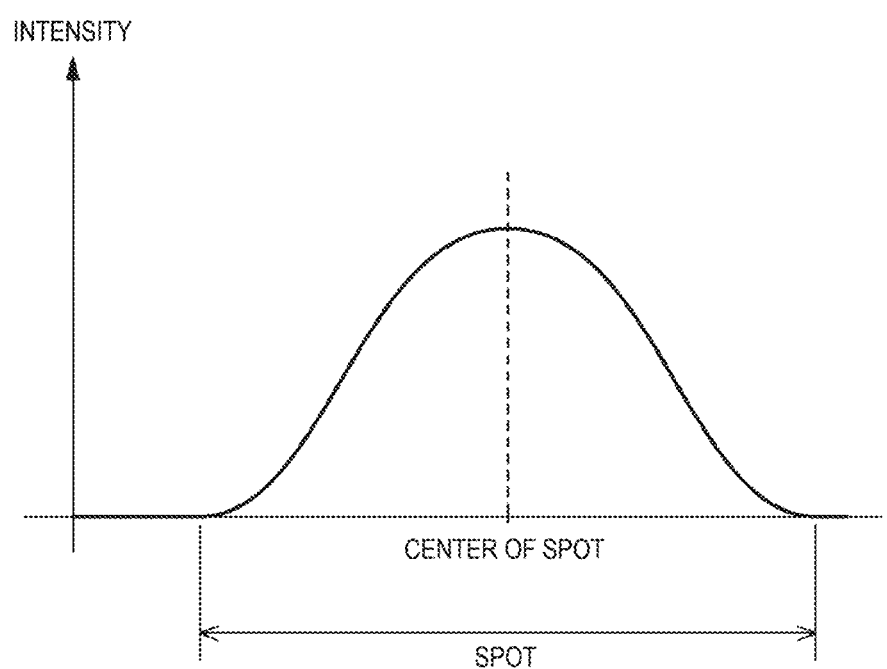
FIG. 9 is a diagram showing an intensity distribution of a laser beam.
Figure 15:
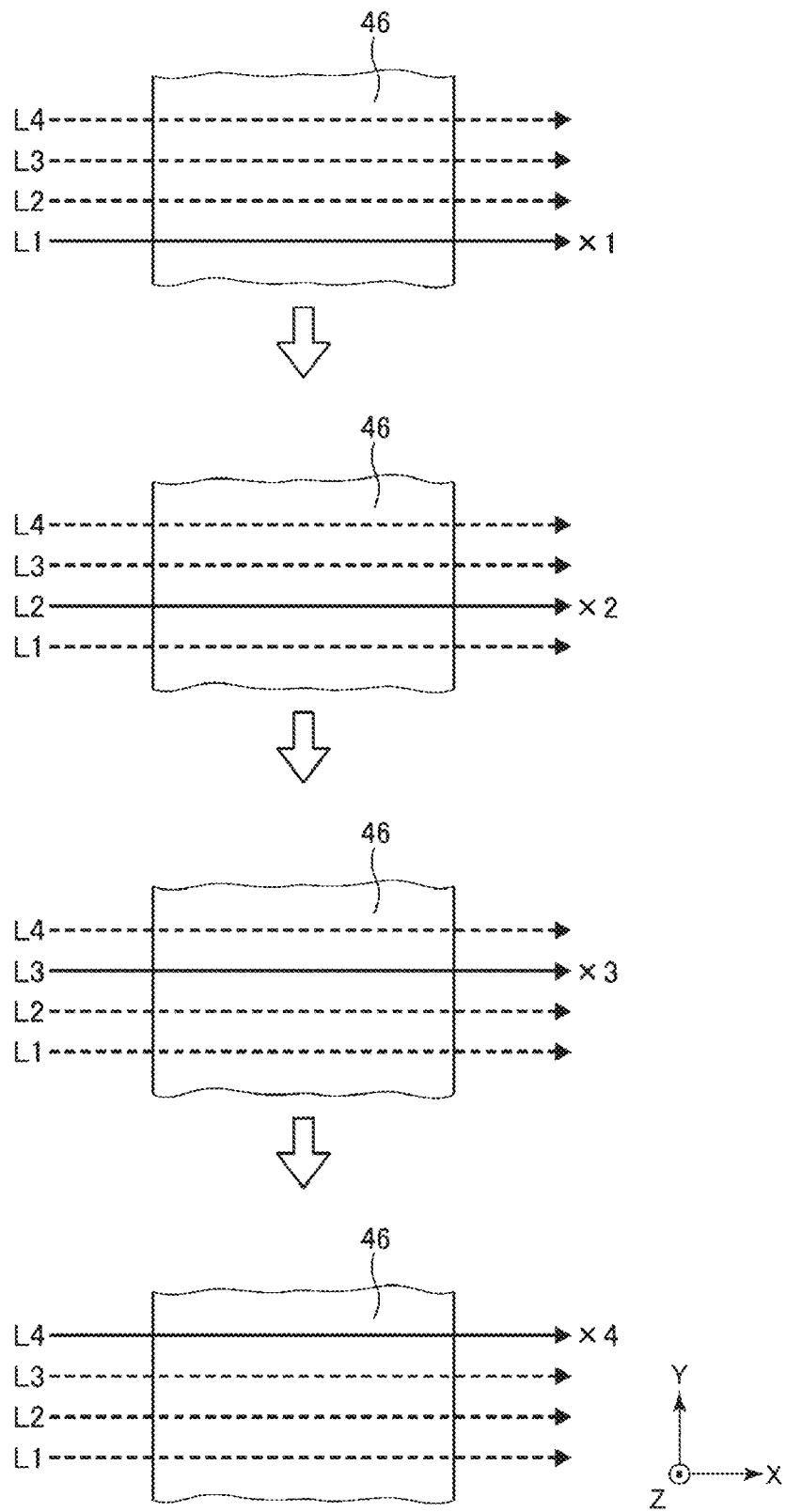
FIG. 15 is a plan view for explaining the method of manufacturing the vibrator device shown in FIG. 1.
Figure 16:
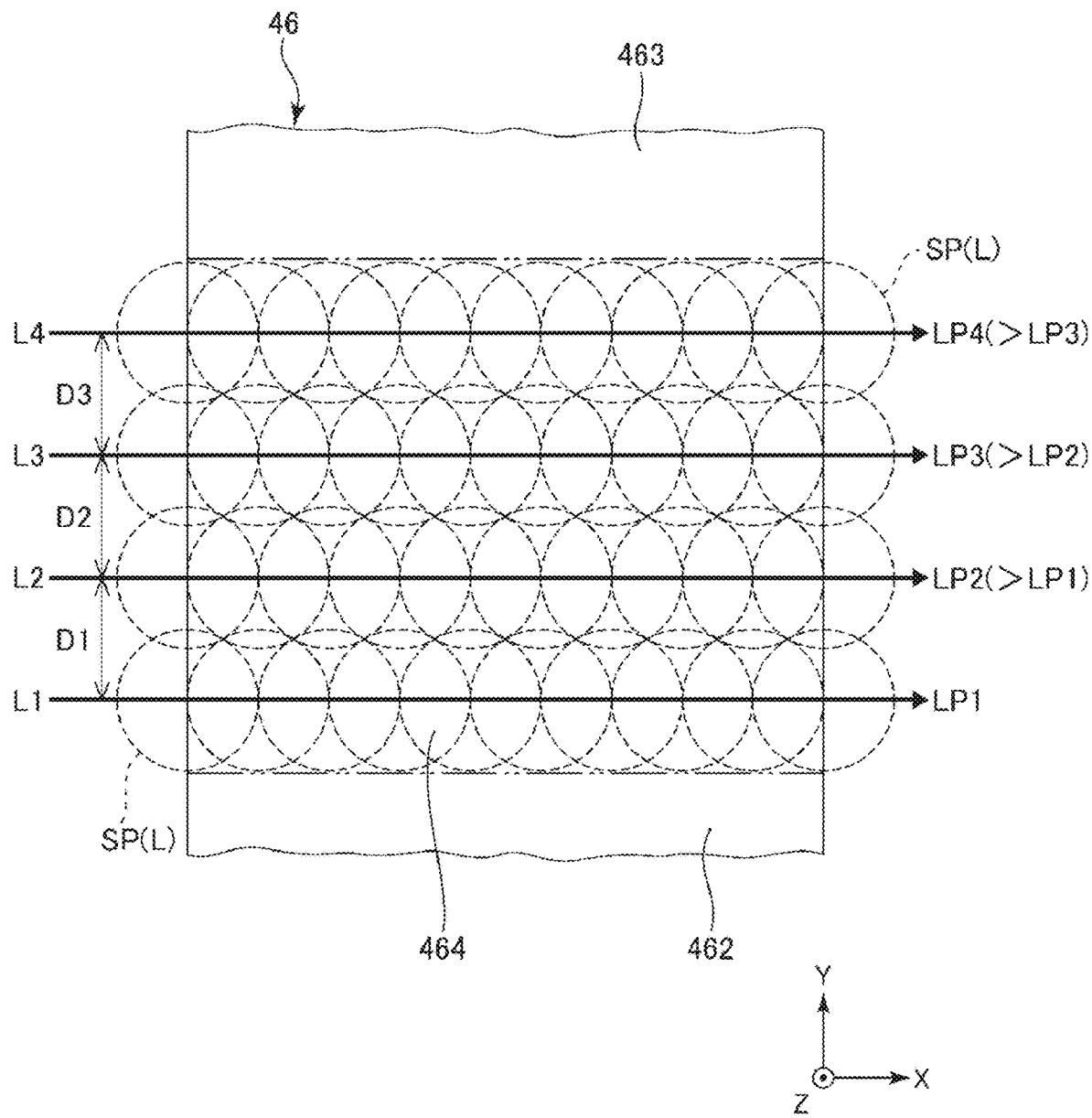
FIG. 16 is a plan view for explaining the method of manufacturing the vibrator device shown in FIG. 1.
Figure 17:
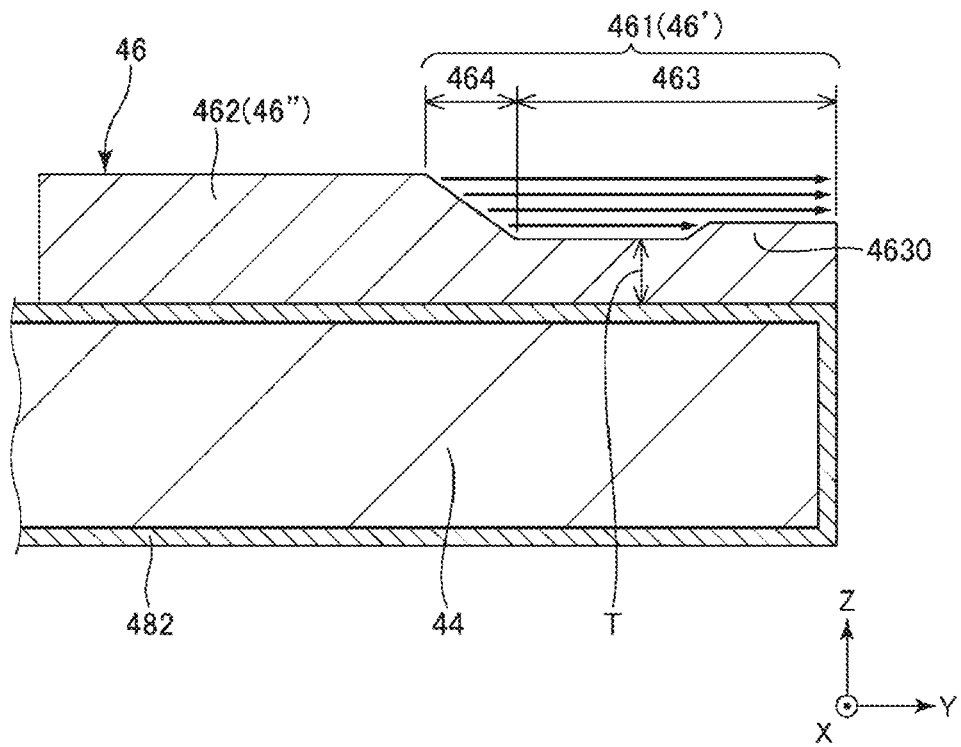
FIG. 17 is a cross-sectional view showing a modified example of the weight.
Figure 18:
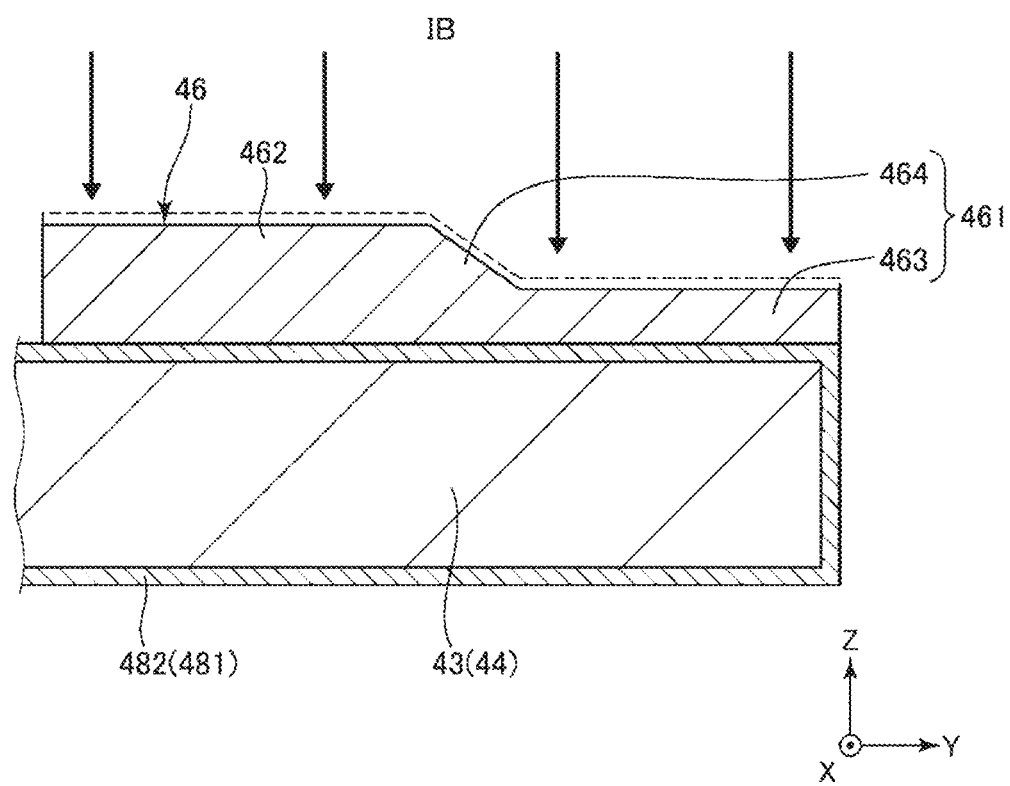
FIG. 18 is a cross-sectional view for explaining the method of manufacturing the vibrator device shown in FIG. 1.

FIG. 1 is a cross-sectional view showing a vibrator device according to a first embodiment of the present disclosure. FIG. 2 is a plan view showing a vibrator element provided to the vibrator device shown in FIG. 1. FIG. 3 is a cross-sectional view along the line A-A in FIG. 2. FIG. 4 and FIG. 5 are each a cross-sectional view showing a weight provided to the vibrator element shown in FIG. 2. FIG. 6 is a diagram showing a manufacturing process of the vibrator device shown in FIG. 1. FIG. 7 is a plan view for explaining a method of manufacturing the vibrator device shown in FIG. 1. FIG. 8 is a cross-sectional view for explaining the method of manufacturing the vibrator device shown in FIG. 1. FIG. 9 is a diagram showing an intensity distribution of a laser beam. FIG. 10 through FIG. 16 are each a plan view for explaining the method of manufacturing the vibrator device shown in FIG. 1. FIG. 17 is a cross-sectional view showing a modified example of the weight. FIG. 18 is a cross-sectional view for explaining the method of manufacturing the vibrator device shown in FIG. 1.

It should be noted that in each of the drawings except FIG. 6 and FIG. 9, there are shown an X axis, a Y axis, and a Z axis as three axes perpendicular to each other for the sake of convenience of explanation. Further, a direction parallel to the X axis is also referred to as an "X-axis direction," a direction parallel to the Y axis is also referred to as a "Y-axis direction," and a direction parallel to the Z axis is also referred to as a "Z-axis direction." Further, the arrow side of each of the axes is also referred to as a positive side, and the opposite side is also referred to as a negative side. Further, the positive side in the Z-axis direction is also referred to as an "upper side," and the negative side thereof is also referred to as a "lower side." Further, a plan view viewed from the Z-axis direction is also referred to simply as a "plan view." Further, as described later, the X axis, the Y axis, and the Z axis correspond to the crystal axes of quartz crystal.

The vibrator device 1 shown in FIG. 1 is used as, for example, an oscillator. Such a vibrator device 1 has a package 3, a vibrator element 4 housed in the package 3, and a circuit element 6.

As shown in FIG. 1, the package 3 has a base 31 provided with a recessed part 311 opening in an upper surface, and a lid 32 which is bonded to the upper surface of the base 31 via a bonding member 33 so as to close the opening of the recessed part 311. The recessed part 311 forms an internal space S inside the package 3, and the vibrator element 4 and the circuit element 6 are housed in the internal space S.

For example, the base 31 can be formed of ceramics such as alumina, and the lid 32 can be formed of a metal material such as kovar. It should be noted that the constituent material of each of the base 31 and the lid 32 is not particularly limited. For example, the lid 32 can be formed of a glass material having a light transmissive property.

Further, the internal space S is airtightly sealed, and is set in a reduced-pressure state, and is preferably set in a state more approximate to a vacuum state. Thus, the viscosity resistance reduces and the vibration characteristics of the vibrator element 4 are improved. It should be noted that the atmosphere in the internal space S is not particularly limited, but can be an atmosphere filled with an inert gas such as nitrogen or Ar, or can be in the atmospheric pressure state or a pressurized state instead of the reduced-pressure state.

Further, the recessed part 311 has a recessed part 311a, a recessed part 311b, and a recessed part 311c wherein the recessed part 311a opens in the upper surface of the base 31, the recessed part 311b opens in a bottom surface of the recessed part 311a and is smaller in opening width than the recessed part 311a, and the recessed part 311c opens in a bottom surface of the recessed part 311b and is smaller in opening width than the recessed part 311b. Further, to the bottom surface of the recessed part 311a, there is fixed the vibrator element 4 via bonding members 2 each having electrical conductivity, and to the bottom surface of the recessed part 311c, there is bonded the circuit element 6.

Further, on the bottom surface of the recessed part 311a, there is disposed a plurality of internal terminals 341, on the bottom surface of the recessed part 311b, there is disposed a plurality of internal terminals 342, and on the lower surface of the base 31, there are disposed external terminals 343. Some of the internal terminals 342 are electrically coupled to the internal terminals 341 via internal interconnections not shown formed inside the base 31, and the rest of the internal terminals 342 are electrically coupled to the external terminal 343 via the internal interconnections described above. Further, each of the internal terminals 342 is electrically coupled to the circuit element 6 via a bonding wire BW.

As shown in FIG. 2, the vibrator element 4 has a vibrating body 41, electrodes provided to the vibrating body 41, and weights 46 as metal films for a frequency adjustment.

The vibrating body 41 is a tuning-fork type quartz crystal vibrator element. The vibrating body 41 is formed of a Z-cut quartz crystal plate, and has spread in an X-Y plane defined by the X axis as an electrical axis and the Y axis as a mechanical axis, the electrical axis and the mechanical axis being crystal axes of quartz crystal, and has a thickness in the Z-axis direction as an optical axis.

It should be noted that the constituent material of the vibrating body 41 is not particularly limited, but there can be used a variety of piezoelectric materials such as lithium niobate ($LiNbO_3$), lithium tantalate ($LiTaO_3$), lead zirconium titanate (PZT), lithium tetraborate ($Li_2B_4O_7$), langasite ($La_3Ga_5SiO_{14}$), potassium niobate ($KNbO_3$), gallium phosphate ($GaPO_4$), gallium arsenide (GaAs), aluminum nitride (AlN), zinc oxide (ZnO, $Zn_2O_3$), barium titanate ($BaTiO_3$), lead titanate ($PbPO_3$), sodium potassium niobate (($K,Na)NbO_3$), bismuth ferrite ($BiFeO_3$), sodium niobate ($NaNbO_3$), bismuth titanate ($Bi_4Ti_3O_{12}$), bismuth sodium titanate ($Na_{0.5}Bi_{0.5}TiO_3$), or there can be used other materials than the piezoelectric material such as a silicon substrate.

Further, the vibrating body 41 has a base part 42, and a pair of vibrating arms 43, 44 extending side by side toward the positive side in the Y-axis direction from the base part 42. Further, in the base part 42, the vibrating body 41 is fixed to the base 31 via the pair of bonding members 2.

Further, as shown in FIG. 3, the vibrating arm 43 has a groove 432 opening in an upper surface, and a groove 433 opening in a lower surface. Similarly, the vibrating arm 44 has a groove 442 opening in an upper surface, and a groove 443 opening in a lower surface. Therefore, the vibrating arms 43, 44 each have a substantially H-shaped lateral cross-sectional shape.

Further, as shown in FIG. 2 and FIG. 3, there are disposed signal electrodes 481 and ground electrodes 482 as electrodes. As shown in FIG. 3, signal electrodes 481 are respectively disposed on an upper surface and a lower surface of the vibrating arm 43, and both side surfaces of the vibrating arm 44. Meanwhile, the ground electrodes 482 are disposed on both side surfaces of the vibrating arm 43, and an upper surface and a lower surface of the vibrating arm 44. Further, the signal electrodes 481 are electrically coupled to the internal terminal 341 via the via one of the bonding members 2, and the ground electrodes 482 are electrically coupled to another internal terminal 341 via the other of the bonding members 2. Thus, the vibrator element 4 and the circuit element 6 are electrically coupled to each other. Further, when the circuit element 6 applies the drive signal to the signal electrodes 481, the vibrating arms 43, 44 make a flexural vibration so as to repeat coming close to each other and getting away from each other as indicated by the arrows in FIG. 2.

Further, as shown in FIG. 2, the weight 46 is disposed on each of the upper surfaces of the tip parts of the vibrating arms 43, 44. The weights 46 are for adjusting the resonance frequency of the vibrator element 4, or adjusting the vibration balance between the vibrating arms 43, 44. As described later, by irradiating the weight 46 with a laser beam L to remove a part of the weight to thereby reduce the mass of the vibrating arms 43, 44 in a first frequency adjustment process included in the manufacturing process of the vibrator element 4, it is possible to adjust the resonance frequency of the vibrator element 4. It should be noted that the configuration of the weight 46 is not particularly limited, but the weight 46 can be formed of a metal coating obtained by stacking layers of, for example, Au (gold) or Al (aluminum), or an alloy consisting primarily of Au (gold) or Al (aluminum). In the present embodiment, the weights 46 are formed of Au (gold).

The weight 46 after the first frequency adjustment process has been completed, namely in the state in which a part of the weight 46 is irradiated with the laser beam L to thereby be removed, is made to have a configuration shown in FIG. 4 and FIG. 5. The weight 46 has a removed part 461 and a thick film part 462. The removed part 461 is a laser-processed part 46' irradiated with the laser beam L in the first frequency adjustment process, and is an area a part of which is removed in the thickness direction to thereby be formed to be a thin film. In contrast, the thick film part 462 is a non-laser-processed part 46" which has not been irradiated with the laser beam L in the first frequency adjustment process, and is an area a part of which has not substantively removed, and is therefore not formed to be a thin film.

Further, the removed part 461 and the thick film part 462 are arranged side by side in the Y-axis direction as a longitudinal direction of the vibrating arms 43, 44, wherein the removed part 461 is located at the tip side of the vibrating arms 43, 44, namely the positive side in the Y-axis direction, with respect to the thick film part 462 in the present embodiment. By disposing the removed part 461 as an area to be processed with the laser beam L closer to the tip side of the vibrating arms 43, 44 than the thick film part 462, in other words, by removing the tip side of the weight 46, in such a manner, the frequency variation per unit mass of the weight 46 thus removed can be made larger. Therefore, it is possible to ensure a sufficient frequency adjustment range in the first frequency adjustment process. It should be noted that the arrangement of the removed part 461 and the thick film part 462 is not particularly limited, but it is possible for the removed part 461 to be located at the negative side in the Y-axis direction of the thick film part 462, or it is possible for the thick film part 462 to be located at both sides in the Y-axis direction of the removed part 461.

Further, the removed part 461 has a thin film part 463 thinner in film thickness T than the thick film part 462, and a connection part 464 which is located between the thin film part 463 and the thick film part 462 to connect the thin film part 463 and the thick film part 462 to each other. The connection part 464 is tilted with respect to the upper surfaces of the vibrating arms 43, 44, and has a taper shape in which the film thickness T gradually decreases in a direction from the thick film part 462 side toward the thin film part 463, namely from the negative side toward the positive side in the Y-axis direction. By providing the connection part 464 with the taper shape as described above, it is possible to prevent a step having a vertical surface, namely a rectangular step, from being formed on the boundary between the thick film part 462 and the thin film part 463. Therefore, it is possible to effectively prevent the involuntary separation of the weight 46 stating from that part.

The film thickness T of the thick film part 462, in other words, the film thickness T of the weight 46 not yet irradiated with the laser beam L in the first frequency adjustment process, is not particularly limited, but is preferably, for example, no thinner than 3 µm and no thicker than 10 µm, is more preferably no thinner than 4 µm and no thicker than 6 µm. Thus, it is possible to ensure a sufficient frequency adjustment range in the first frequency adjustment process. Further, the film thickness T of the thin film part 463, in other words, the film thickness T of the thin film part 463 having been irradiated with the laser beam L in the first frequency adjustment process, is not particularly limited, but is preferably, for example, no thinner than 0.5 µm, and is more preferably no thinner than 1 µm. Thus, it is possible to effectively prevent the thin film part 463 from becoming excessively thin to deteriorate the adhesiveness between the vibrating arms 43, 44.

Further, an average value of the tilt angle θ of the connection part 464, namely the tilt with respect to the upper surface of the vibrating arms 43, 44, is not particularly limited, but is preferably, for example, no larger than 60°, more preferably no larger than 55°, and further more preferably no larger than 50°. Thus, the advantage described above, namely the separation prevention effect of the weight 46, becomes more conspicuous. On the other hand, the lower limit value of the tilt angle θ is not particularly limited, but is preferably no smaller than 20°, more preferably no smaller than 25°, and further more preferably no smaller than 35°. Thus, it is possible to suppress the length in the Y-axis direction of the connection part 464. Further, accordingly, the area of the thin film part 463 can be ensured to sufficiently be large, and it is possible to ensure sufficient frequency adjustment range in the first frequency adjustment process.

Here, although the taper angle θ is described as constant in the Y-axis direction in FIG. 3 and FIG. 4, this is not a limitation, but the connection part 464 can be provided with a part in which the taper angle θ varies in the Y-axis direction or the X-axis direction. In this case, it is sufficient for the average value of the taper angle θ to be within the value described above.

In the present embodiment, the upper surface of the connection part 464 is formed of a tilted plane, and the decrement rate of the film thickness T is constant along the Y-axis direction, but this is not a limitation. For example, it is possible that the upper surface of the connection part 464 is formed of a convexly curved surface, and the decrement rate of the film thickness T gradually increase toward the positive side in the Y-axis direction, and on the contrary, it is possible that the upper surface of the connection part 464 is formed of a concavely curved surface, and the decrement rate of the thickness T gradually decreases toward the positive side in the Y-axis direction. Further, it is possible to adopt a configuration in which a plurality of planes different in tilt angle from each other is arranged side by side in the Y-axis direction instead of the convexly curved surface or the concavely curved surface.

As shown in FIG. 1, the circuit element 6 is fixed to the bottom surface of the recessed part 311c. Such a circuit element 6 includes, for example, an interface section for performing communication with an external host device, and an oscillation circuit for oscillating the vibrator element 4. It should be noted that the circuit element 6 can be omitted, or can also be disposed outside the package 3.

The configuration of the vibrator device 1 is hereinabove described. Then, a method of manufacturing the vibrator device 1 will be described. As shown in FIG. 6, the method of manufacturing the vibrator device 1 includes a preparation process of preparing the vibrator element 4, the first frequency adjustment process of adjusting the frequency of the vibrator element 4 on a quartz crystal wafer 40, a mounting process of mounting the vibrator element 4 on the base 31, a second frequency adjustment process of adjusting the frequency of the vibrator element 4 on the base 31, and a sealing process of bonding the lid 32 to the base 31.

Preparation Process

First, as shown in FIG. 7, by preparing the quartz crystal wafer 40 and patterning the quartz crystal wafer 40 using a photolithography technique and an etching technique, a plurality of vibrating bodies 41 is provided to the quartz crystal wafer 40. Then, the electrodes are formed on the surfaces of the vibrating bodies 41 using sputtering, and further, the weight 46 is formed in each of the tip parts of the vibrating arms 43, 44.

First Frequency Adjustment Process

Then, the resonance frequency of the vibrator element 4 is adjusted on the quartz crystal wafer 40. Specifically, as shown in FIG. 8, the weights 46 provided to the vibrating arms 43, 44 are irradiated with the laser beam L to remove a part of each of the weights 46 to reduce the mass thereof to thereby adjust the resonance frequency of the vibrator element 4 to tune the resonance frequency of the vibrator element 4 into a target value.

The laser beam L is not particularly limited, but there can be used a pulsed laser beam such as YAG, $YVO_4$, or excimer laser, or a continuous oscillation laser beam such as carbon dioxide laser beam. It should be noted that in the present embodiment, the pulsed laser beam is used as the laser beam L. Specifically, by continuously irradiating the weights 46 with the laser beam L converged like a spot to thereby process the weights 46. By using the pulsed laser beam as the laser beam L in such a manner to thereby change the irradiation time or the irradiation pitch while keeping the intensity of the laser beam L without changing the intensity, it is possible to control an amount of irradiation, namely an amount of energy, of the laser beam L per unit area to the weights 46. Therefore, the laser beam L is stabilized, and it is possible to accurately perform the present process.

The spot diameter of the laser beam L is not particularly limited, but is preferably, for example, no larger than 20 μm, and is more preferably no larger than 15 μm. Thus, sufficient microfabrication on the weights 46 becomes possible.

Further, the laser beam L is not particularly limited, but is preferably a picosecond laser beam. It should be noted that the picosecond laser beam is what is obtained by shortening the pulse width of the laser beam L to the picosecond level. By using the picosecond laser, it is possible to evaporate the weights 46 with higher peak power compared to, for example, a typical YAG laser. Therefore, processing low in thermal influence becomes possible. Further, it is possible to effectively prevent reattachment of the weight material having been evaporated to a surface of the weights 46, and thus, it is possible to effectively prevent dross from being attached to the surface of the weights 46. Therefore, it is possible to effectively prevent the dross from being separated from the weights 46, and accordingly, the resonance frequency of the vibrator element 4 from varying. Therefore, the reliability of the vibrator element 4 is improved.

Further, the pulse width of the laser beam L is not particularly limited, but is preferably shorter than collisional relaxation time as the time for the lattice ion temperature of the constituent material of the weights 46 to be raised to the melting point. Thus, the advantage described above becomes more conspicuous. In the present embodiment, the weights 46 are formed of Au (gold), and the collisional relaxation time of Au is about 25 picoseconds. Therefore, the pulse width of the laser beam L is preferably no more than 25 picoseconds, more preferably no more than 20 picoseconds, and further more preferably no more than 10 picoseconds.

Further, as shown in FIG. 9, the intensity of the laser beam L has a Gaussian distribution, and gradually decreases in a direction from a central part of the spot toward the peripheral part thereof. By using the laser beam L having such an intensity distribution, processing in the peripheral part of the spot is prevented, and the processing finer than the spot diameter, namely microfabrication, becomes possible. Further, it is possible to form the tilted surface of the connection part 464 to be smoother.

Figure 10:
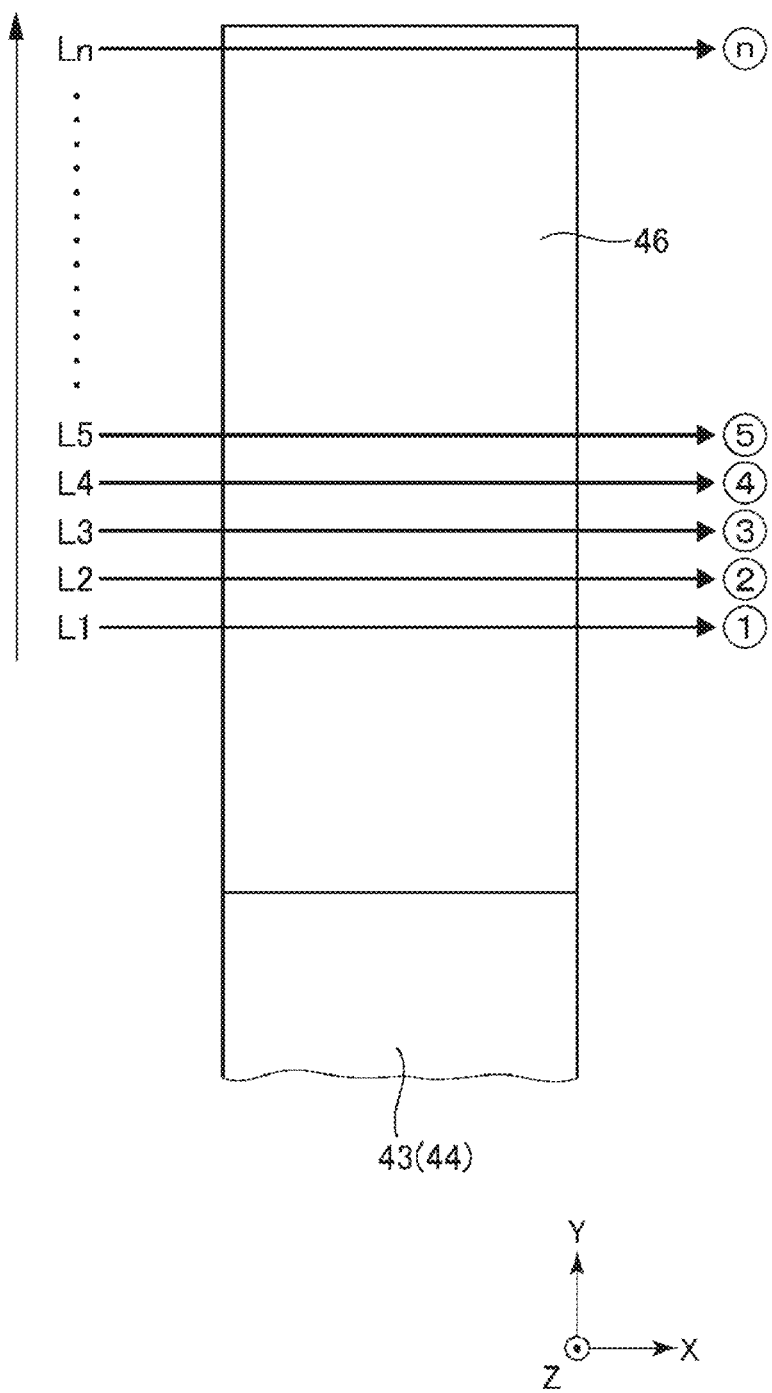
FIG. 10 is a plan view for explaining the method of manufacturing the vibrator device shown in FIG. 1.

Further, in the present process, the weights 46 is irradiated with the laser beam L in the order shown in FIG. 10. Specifically, main scanning with the laser beam L is performed along the X-axis direction as a width direction of the vibrating arms 43, 44, and at the same time, sub-scanning is performed from a base end side of the vibrating arms 43, 44 toward the tip side, namely from the thick film part 462 side toward the removed part 461. Specifically, first, scanning with the laser beam L is performed along a line L1 located closest to the base end of the removed part 461, then scanning with the laser beam L is performed along a line L2 adjacent to the line L1, then scanning with the laser beam L is performed along a line L3 adjacent to the line L2, and the above is repeatedly performed in sequence to line Ln located at the tip of the removed part 461.

It should be noted that as described above, since it is necessary to provide the weight 46 with the thick film part 462 not irradiated with the laser beam L, and the removed part 461 which is located at the tip side of the thick film part 462, and which is irradiated with the laser beam L, the line L1 fails to overlap the base end of the weight 46, but is located closer to the tip than the base end. By performing the sub-scanning with the laser beam L from the thick film part 462 side toward the removed part 461 in such a manner, in other words, by irradiating the weight 46 with the laser beam L in sequence from a near side to the thick film part 462 toward a far side therefrom, it becomes difficult for the evaporated weight material to adhere to the thick film part 462, and it is possible to effectively prevent the dross from adhering to the thick film part 462.

Further, on this occasion, in the area where the thin film part 463 is formed, an amount of irradiation with the laser beam L to each part is made equal. Thus, it is possible to form the thin film part 463 substantially constant in film thickness T. On the other hand, in the area where the connection part 464 is formed, the amount of irradiation with the laser beam L is gradually increased in a direction from the thick film part 462 side toward the thin film part 463, namely from the negative side toward the positive side in the Y-axis direction. The "amount of irradiation" described above can be reworded as an amount of irradiation per unit area, namely an amount of energy. Thus, an amount of removal of the weight 46 gradually increases in a direction from the thick film part 462 side toward the thin film part 463, and thus, the connection part 464 having a taper shape is formed therebetween. Further, since the closer to the thick film part 462 an area is, the smaller the amount of removal of the weight 46 in that area becomes, it is possible to effectively prevent the dross from adhering to the thick film part 462.

Then, there will be described some methods of gradually increasing an amount of irradiation with the laser beam L in the direction from the thick film part 462 side toward the thin film part 463 in the connection part 464. It should be noted that it is hereinafter assumed that the connection part 464 is formed by performing the irradiation with the laser beam L along the lines L1, L2, L3, and L4 for the sake of convenience of explanation.

Figure 11:
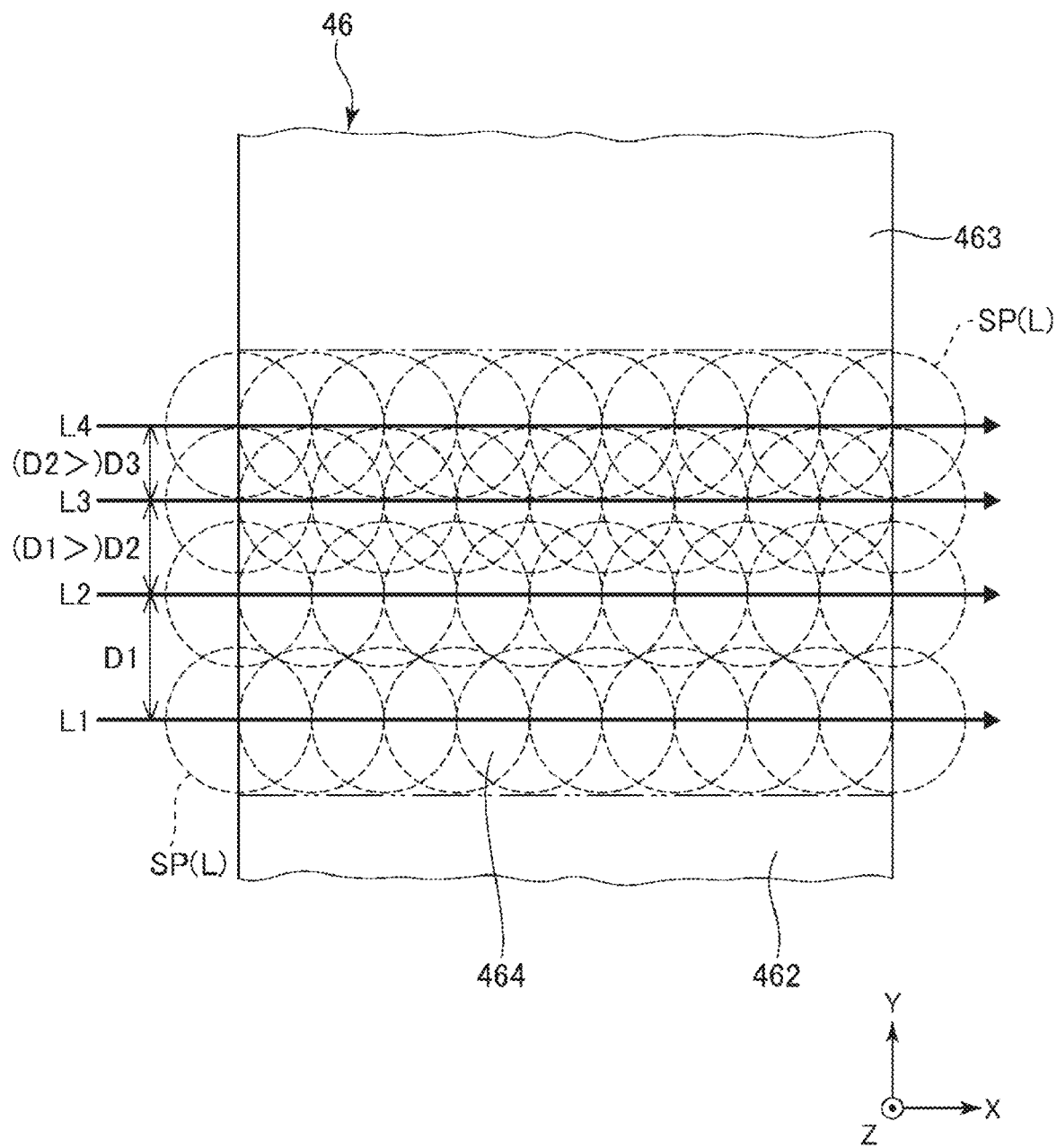
FIG. 11 is a plan view for explaining the method of manufacturing the vibrator device shown in FIG. 1.

As a first method, there can be cited a method of making the irradiation pitch with the laser beam L shorter at the thin film part 463 side than at the thick film part 462 side, in particular, a method of gradually reducing the irradiation pitch with the laser beam L in the direction from the thick film part 462 side toward the thin film part 463. Specifically, the intensity and the pulse width of the laser beam L are made constant, and the moving speed of the laser beam L on the lines L1, L2, L3, and L4 is made constant, and further, as shown in FIG. 11, a separation distance D1 between the lines L1, L2, a separation distance D2 between the lines L2, L3, and a separation distance D3 between the lines L3, L4 are made to fulfill D1>D2>D3. According to such a method, it is possible to make the amount of irradiation with the laser beam L gradually increase in the direction from the thick film part 462 side toward the thin film part 463 with a simple method.

In particular, by making the change rates between the separation distances D1, D2, and D3, namely D1/D2 and D2/D3, equal to each other, it is possible to make the tilted surface of the connection part 464 be a smoother plane.

It should be noted that the separation distances D1, D2, and D3 are each smaller than the diameter of the spot SP of the laser beam L, the spot SP on the line L2 overlaps the spot SP on the line L1, the spot SP on the line L3 overlaps the spot SP on the line L2, and a part of the spot SP on the line L4 overlaps the spot SP on the line L3. Further, on each of the lines L1, L2, L3, and L4, the spots SP adjacent in the X-axis direction to each other overlap each other. By performing the processing so that the spots SP adjacent to each other in both of the Y-axis direction and the X-axis direction overlap each other in such a manner, the accurate processing becomes possible.

Figure 12:
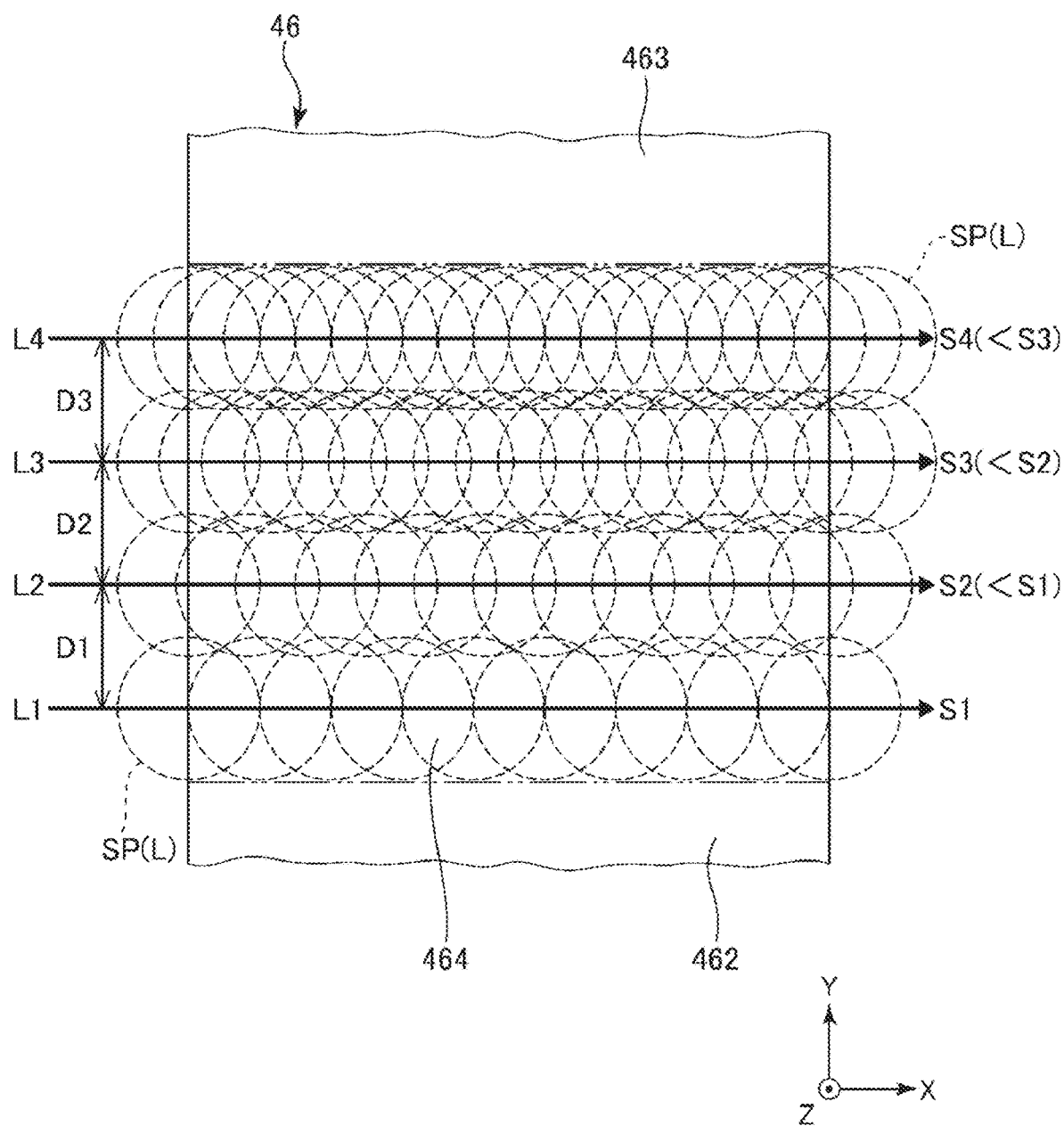
FIG. 12 is a plan view for explaining the method of manufacturing the vibrator device shown in FIG. 1.

As a second method, there can be cited a method of making the moving speed of the laser beam L lower at the thin film part 463 side than at the thick film part 462 side, in particular, a method of gradually lowering the moving speed of the laser beam L in the direction from the thick film part 462 side toward the thin film part 463. Specifically, the intensity and the pulse width of the laser beam L are made constant, and further, as shown in FIG. 12, the separation distances D1, D2, and D3 are made equal to each other, and further the moving speed S1 of the laser beam L on the line L1, the moving speed S2 of the laser beam L on the line L2, the moving speed S3 of the laser beam L on the line L3, and the moving speed S4 of the laser beam L on the line L4 are made to fulfill S1>S2>S3>S4. According to such a method, it is possible to make the amount of irradiation with the laser beam L gradually increase in the direction from the thick film part 462 side toward the thin film part 463 with a simple method.

In particular, by making the change rates between the moving speeds S1, S2, S3, and S4, namely S1/S2, S2/S3, and S3/S4 substantially equal to each other, it is possible to make the tilted surface of the connection part 464 be a smoother plane.

The moving speed S1 can be reworded as a pitch of the spots SP on the line L1, the moving speed S2 can be reworded as a pitch of the spots SP on the line L2, the moving speed S3 can be reworded as a pitch of the spots SP on the line L3, and the moving speed S4 can be reworded as a pitch of the spots SP on the line L4. Further, the moving speeds S1, S2, S3, and S4 are set so that the pitch on each of the lines L1, L2, L3, and L4 is smaller than the diameter of the spot SP, and the spots SP adjacent in the X-axis direction to each other overlap each other on each of the lines L1, L2, L3, and L4.

Figure 13:
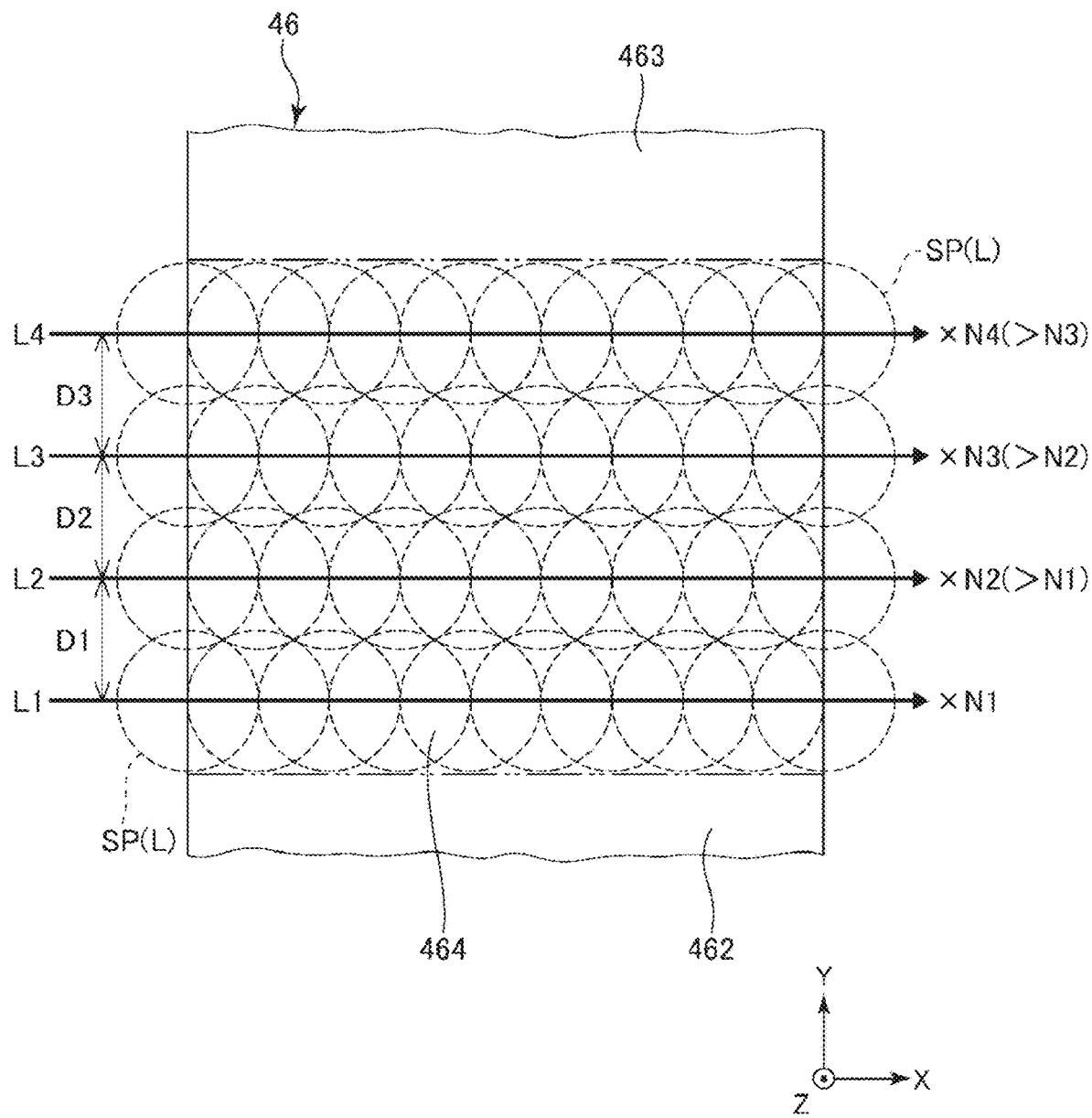
FIG. 13 is a plan view for explaining the method of manufacturing the vibrator device shown in FIG. 1.

As a third method, there can be cited a method of making the number of times of irradiation with the laser beam L larger at the thin film part 463 side than at the thick film part 462 side, in particular, a method of gradually increasing the number of times of irradiation with the laser beam L in the direction from the thick film part 462 side toward the thin film part 463. In particular, the intensity and the pulse width of the laser beam L are made constant, the moving speeds S1, S2, S3, and S4 of the laser beam L on the lines L1, L2, L3, and L4 are made constant, and the separation distances D1, D2, and D3 are made equal to each other, and further, as shown in FIG. 13, the number of times N1 of scanning with the laser beam L along the line L1, the number of times N2 of scanning with the laser beam L along the line L2, the number of times N3 of scanning with the laser beam L along the line L3, and the number of times N4 of scanning with the laser beam L along the line L4 are made to fulfill N1<N2<N3<N4. According to such a method, it is possible to make the amount of irradiation with the laser beam L gradually increase in the direction from the thick film part 462 side toward the thin film part 463 with a simple method.

In particular, since it is possible to perform processing of the weights 46 while the intensity of the laser beam L, the moving speed on each of the lines L1, L2, L3, and L4, and the separation distances D1, D2, and D3 are kept constant, in other words, while keeping a larger number of conditions constant, the operation thereof becomes simpler. Further, for example, by setting N1=1, N2=2, N3=3, and N4=4, and making N2−N1, N3−N2, and N4−N3 equal to each other, it is possible to make the tilted surface of the connection part 464 be a smoother plane.

In this method, for example, as shown in FIG. 14, it is possible to first perform the scanning with the laser beam L once along each of the lines L1, L2, L3, and L4, then perform the scanning with the laser beam L once along each of the lines L2, L3, and L4, then perform the scanning with the laser beam L once along each of the lines L3, L4, and lastly perform the scanning with the laser beam L along the line L4. Further, as shown in FIG. 15, it is possible to first perform the scanning with the laser beam L once along the line L1, then perform the scanning with the laser beam L twice along the line L2, then perform the scanning with the laser beam L three times along the line L3, and lastly perform the scanning with the laser beam L four times along the line L4.

As a fourth method, there can be cited a method of making the intensity of the laser beam L higher at the thin film part 463 side than at the thick film part 462 side, in particular, a method of gradually raising the intensity of the laser beam L in the direction from the thick film part 462 side toward the thin film part 463. Specifically, the moving speeds S1, S2, S3, and S4 of the laser beam L on the lines L1, L2, L3, and L4 are made constant, and the separation distances D1, D2, and D3 are made equal to each other, and further, as shown in FIG. 16, the intensity LP1 of the laser beam L on the line L1, the intensity LP2 of the laser beam L on the line L2, the intensity LP3 of the laser beam L on the line L3, and the intensity LP4 of the laser beam L on the line L4 are made to fulfill LP1<LP2<LP3<LP4. According to such a method, it is possible to make the amount of irradiation with the laser beam L gradually increase in the direction from the thick film part 462 side toward the thin film part 463 with a simple method.

In particular, by making the change rates between the intensities LP1, LP2, LP3, and LP4, namely LP1/LP2, LP2/LP3, and LP3/LP4 equal to each other, it is possible to make the tilted surface of the connection part 464 be a smoother plane.

By adjusting the frequency on the quartz crystal wafer 40, namely before mounting the vibrator element 4 on the base 31, in such a manner, it is possible to prevent the harmful influence due to the weight 46 evaporated when performing the adjustment adhering to the base 31.

It should be noted that in, for example, the method shown in FIG. 14, when the resonance frequency of the vibrator element 4 reaches the target value before the fourth irradiation with the laser beam L up to the line Ln is completed, it is sufficient to terminate the irradiation with the laser beam L at that moment. In this case, as shown in FIG. 17, a part 4630 thicker in film thickness T than the base part is formed in the tip part of the thin film part 463. The part 4630 is used for fine tuning of the resonance frequency of the vibrator element 4 after, for example, the mounting process.

Mounting Process

Then, the vibrator element 4 is broken off from the quartz crystal wafer 40, and then the vibrator element 4 thus broken off is bonded to the base 31.

Second Frequency Adjustment Process

There is a possibility that by fixing the vibrator element 4 to the base 31 in the mounting process described above, the resonance frequency of the vibrator element 4 varies from the resonance frequency on the quartz crystal wafer 40. Therefore, in the present process, a part of the weight 46 is removed using an ion beam to adjust the resonance frequency of the vibrator element 4. Specifically, a vacuum state is set, and as shown in FIG. 18, the entire area of each of the weights 46 of the vibrating arms 43, 44 is irradiated with an ion beam IB to thinly remove the entire surface layer of each of the weights 46. By removing a part of each of the weights 46 in such a manner, the resonance frequency of the vibrator element 4 is adjusted to the target value. It should be noted that the present process can be omitted when not required.

Sealing Process

Then, in the vacuum state, for example, the lid 32 is seam welded to an upper surface of the base 31 via the bonding member 33 made of a seam ring. Thus, the internal space S is airtightly sealed, and the vibrator device 1 is obtained.

The vibrator device 1 is hereinabove described. The vibrator element 4 provided to such a vibrator device 1 has the base part 42, the vibrating arms 43, 44 extending from the base part 42, and the weights 46 respectively provided to the vibrating arms 43, 44. Further, the weights 46 each have the thick film part 462, a thin film part 463 thinner in film thickness T than the thick film part 462, and the connection part 464 which is located between the thick film part 462 and the thin film part 463 to connect the thick film part 462 and the thin film part 463 to each other, and which forms the taper shape with the film thickness T gradually decreasing in the direction from the thick film part 462 side toward the thin film part 463. By disposing the connection part 464 forming the taper shape between the thick film part 462 and the thin film part 463 as described above, it is possible to prevent a step having a vertical surface, namely a rectangular step, from being formed on the boundary between the thick film part 462 and the thin film part 463. Therefore, it is possible to effectively prevent the separation of the weight 46 stating from that part. As a result, it is possible to obtain the vibrator element 4 having a more appropriate frequency.

Further, as described above, the thin film part 463 and the connection part 464 are each the laser-processed part 46' made to be a thin film by the irradiation with the laser beam L. Thus, it is possible to adjust the resonance frequency of the vibrator element 4.

Further, as described above, the thin film part 463 is located at the tip side of the vibrating arms 43, 44 with respect to the thick film part 462. By disposing the removed part 461 as the laser-processed part 46' closer to the tip side of the vibrating arms 43, 44 than the thick film part 462, in other words, by removing the tip side of the weight 46, in such a manner, the frequency variation per unit mass of the weight 46 thus removed can be made larger. Therefore, it is possible to ensure a sufficient frequency adjustment range in the first frequency adjustment process.

Further, as described above, it is preferable for the tilt angle θ of the connection part 464 to be equal to or smaller than 60°. Thus, the separation prevention effect of the weight 46 becomes more conspicuous. On the other hand, it is preferable for the tilt angle θ of the connection part 464 to be equal to or larger than 20°. Thus, it is possible to suppress the length in the Y-axis direction of the connection part 464. Further, accordingly, the area of the thin film part 463 can be ensured to sufficiently be large, and it is possible to ensure a sufficient frequency adjustment range in the first frequency adjustment process.

Further, as described above, the vibrator device 1 has the vibrator element 4. Thus, it is possible to appreciate the advantages of the vibrator element 4, and thus, the vibrator device 1 high in reliability is obtained.

Second Embodiment

Figure 19:
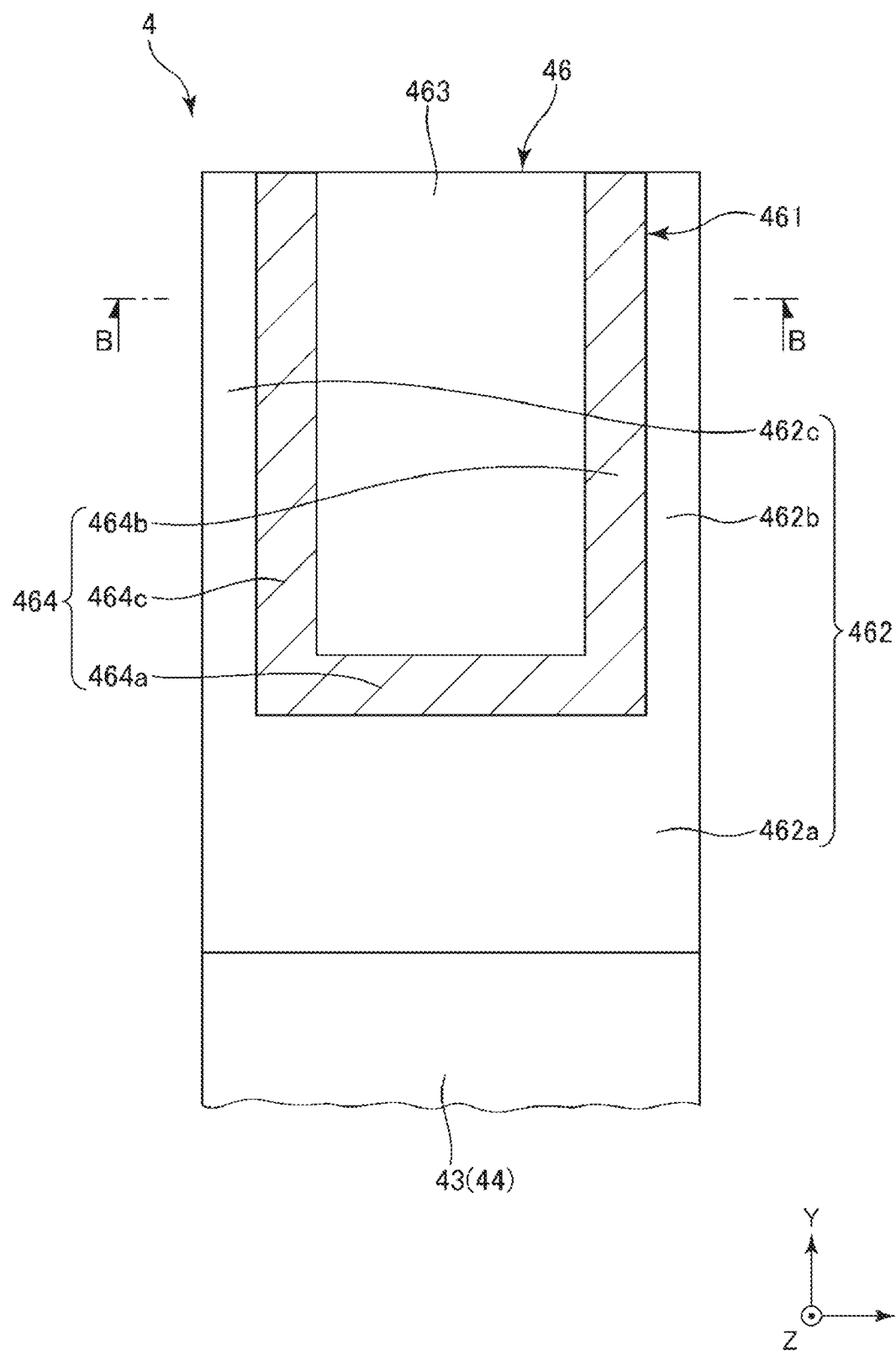
FIG. 19 is a plan view showing a weight provided to a vibrator element according to a second embodiment of the present disclosure.
Figure 20:
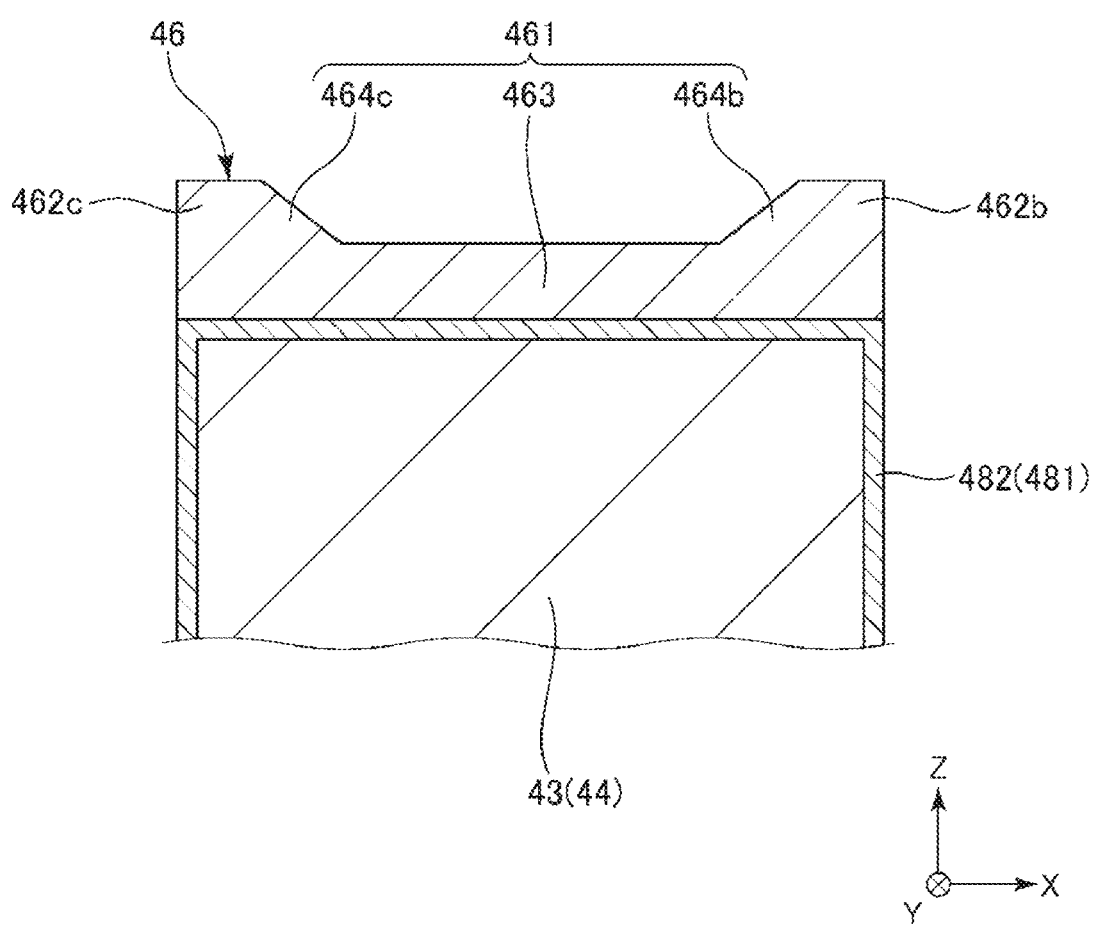
FIG. 20 is a cross-sectional view along the line B-B in FIG. 19.
Figure 21:
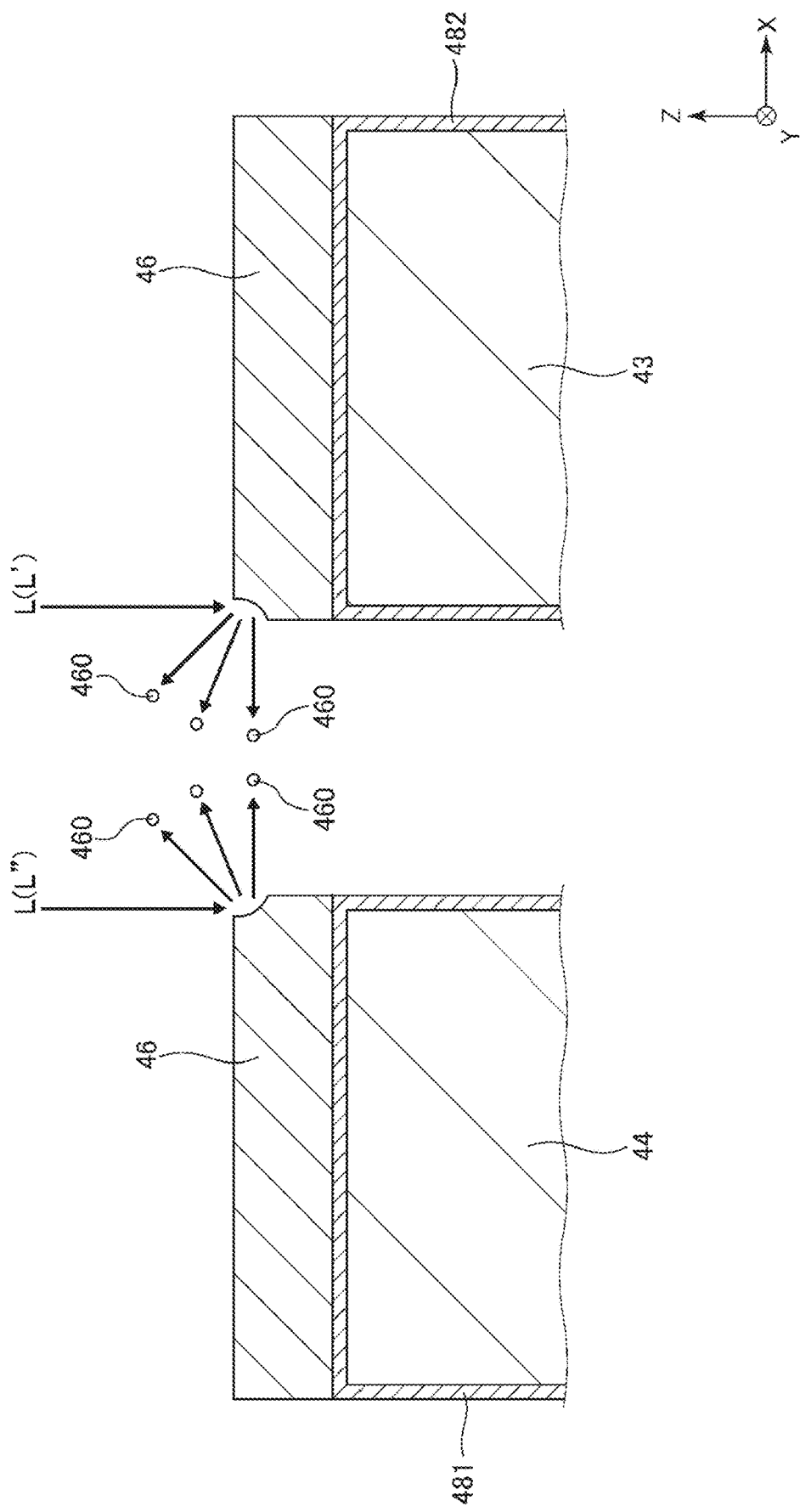
FIG. 21 is a cross-sectional view for explaining an advantage of the weight.

FIG. 19 is a plan view showing a weight provided to a vibrator element according to a second embodiment of the present disclosure. FIG. 20 is a cross-sectional view along the line B-B in FIG. 19. FIG. 21 is a cross-sectional view for explaining an advantage of the weight.

The vibrator device 1 according to the present embodiment is substantially the same as the vibrator device 1 according to the first embodiment described above except the point that the configuration of the weights 46, specifically the configuration of the removed part 461, is different. It should be noted that in the following description, the vibrator device 1 according to the second embodiment will be described with a focus on the difference from the embodiment described above, and the description of substantially the same issues will be omitted. Further, in FIG. 19 through FIG. 21, the constituents substantially the same as those of the first embodiment described above are denoted by the same reference symbols.

As shown in FIG. 19 and FIG. 20, in the weights 46 provided to the vibrator element 4 according to the present embodiment, the thick film part 462 is disposed not only at the negative side in the Y-axis direction of the removed part 461, but also at both sides in the X-axis direction thereof. In other words, the thick film part 462 has a first part 462a located at the negative side in the Y-axis direction of the removed part 461, a second part 462b located at the positive side in the X-axis direction of the removed part 461, and a third part 462c located at the negative side in the X-axis direction of the removed part 461.

Further, in the removed part 461, the connection part 464 having a taper shape is disposed not only at the negative side in the Y-axis direction of the thin film part 463, but also at both sides in the X-axis direction thereof. In other words, the connection part 464 has a first part 464a, a second part 464b, and a third part 464c wherein the first part 464a is located at the negative side in the Y-axis direction of the thin film part 463 to connect the thin film part 463 and the first part 462a of the thick film part 462 to each other, the second part 464b is located at the positive side in the X-axis direction of the thin film part 463 to connect the thin film part 463 and the second part 462b of the thick film part 462 to each other, and the third part 464c is located at the negative side in the X-axis direction of the thin film part 463 to connect the thin film part 463 and the third part 462c of the thick film part 462 to each other.

For example, when the removed part 461 opens at the both sides in the X-axis direction of the weight 46 as in the first embodiment described above, when a corner part at the negative side in the X-axis direction of the weight 46 on the vibrating arm 43 is irradiated with the laser beam L (L') as shown in FIG. 21, it becomes easy for the weight material 460 evaporated from that part to fly toward the vibrating arm 44 adjacent to the vibrating arm 43. On the other hand, when the corner part at the positive side in the X-axis direction of the weight 46 on the vibrating arm 44 is irradiated with the laser beam L (L″), it becomes easy for the weight material 460 evaporated from that part to fly toward the vibrating arm 43 adjacent to the vibrating arm 44. Therefore, there is a possibility that it becomes easy for the dross to be attached to the weight 46 due to the weight material 460 evaporated from the weight 46 adjacent thereto.

Therefore, by adopting the configuration in which the thick film part 462 is also disposed at the both sides in the X-axis direction of the removed part 461 to thereby prevent the corner parts at the both sides in the X-axis direction of the weight 46 from being irradiated with the laser beam L as in the present embodiment, it is possible to effectively prevent the adhesion of the dross described above.

According also to such a second embodiment described hereinabove, substantially the same advantages as in the first embodiment described above can be exerted. It should be noted that it is possible to omit the second part 462b and the second part 464b from the weight 46 on the vibrating arm 43, and it is possible to omit the third part 462c and the third part 464c from the weight 46 on the vibrating arm 44.

Third Embodiment

Figure 22:
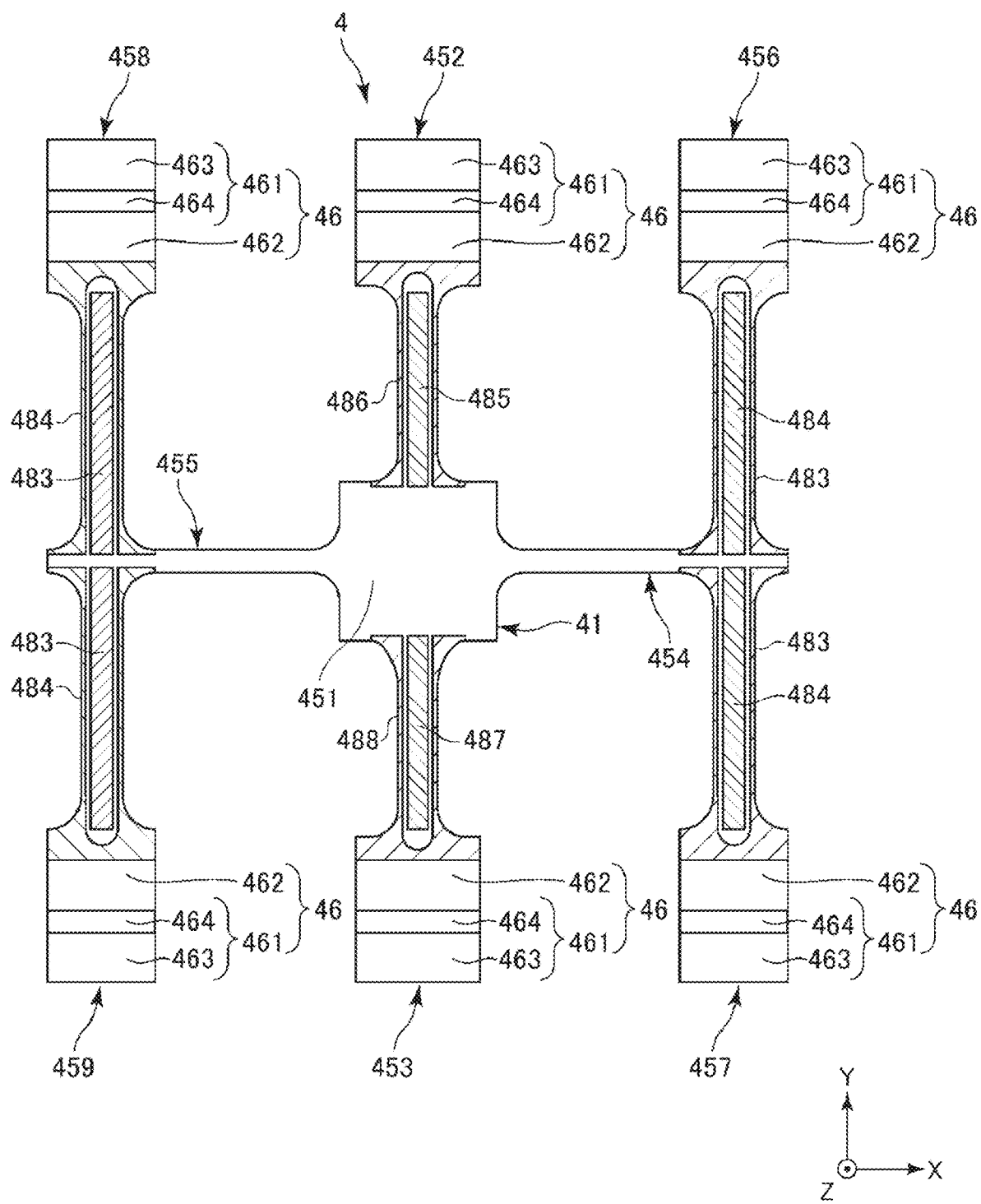
FIG. 22 is a plan view showing a vibrator element according to a third embodiment of the present disclosure.
Figure 23:
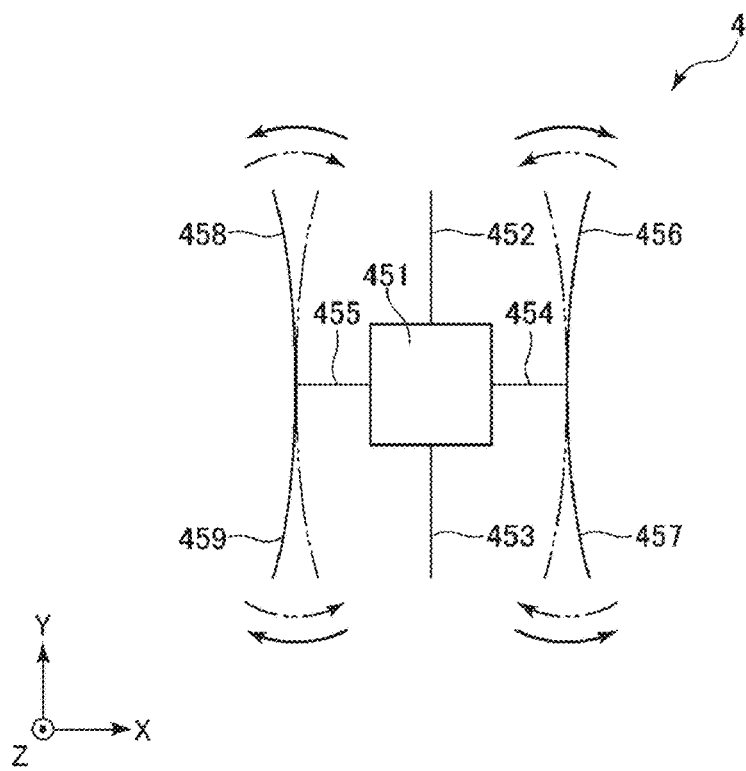
FIG. 23 is a schematic diagram for explaining an action of the vibrator element shown in FIG. 22.
Figure 24:
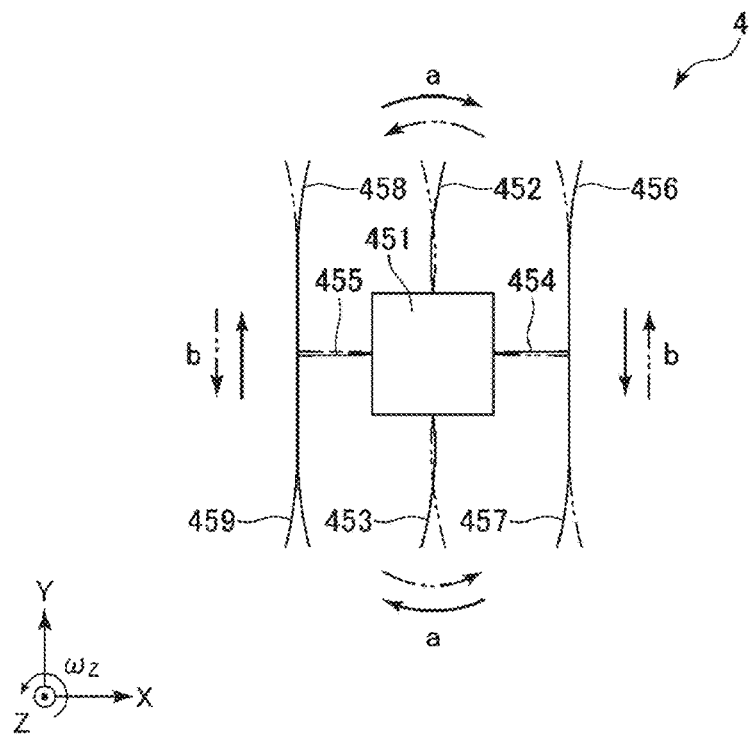
FIG. 24 is a schematic diagram for explaining an action of the vibrator element shown in FIG. 22.

FIG. 22 is a plan view showing a vibrator element according to a third embodiment of the present disclosure. FIG. 23 and FIG. 24 are each a schematic diagram for explaining an action of the vibrator element shown in FIG. 22.

The vibrator device 1 according to the present embodiment is substantially the same as the vibrator device 1 according to the first embodiment described above except the point that the configuration of the vibrator element 4 is different. It should be noted that in the following description, the vibrator device 1 according to the third embodiment will be described with a focus on the difference from the embodiments described above, and the description of substantially the same issues will be omitted. Further, in FIG. 22, the constituents substantially the same as those of the first embodiment described above are denoted by the same reference symbols.

The vibrator element 4 according to the present embodiment is an angular velocity sensor element capable of detecting the angular velocity $\omega z$ defining the Z axis as a detection axis as the physical quantity sensor element. As shown in FIG. 22, the vibrator element 4 has the vibrating body 41, electrodes provided to the vibrating body 41, and the weights 46 as metal films for a frequency adjustment.

Further, the vibrating body 41 is formed of a Z-cut quartz crystal substrate, and has a base part 451, a pair of detection arms 452, 453, a pair of coupling arms 454, 455, a pair of drive arms 456, 457, and a pair of drive arms 458, 459, wherein the base part 451 is located in a central portion, the pair of detection arms 452, 453 are the vibrating arms extending toward both sides in the Y-axis direction from the base part 451, the pair of coupling arms 454, 455 extend toward both sides in the X-axis direction from the base part 451, the pair of drive arms 456, 457 are the vibrating arms extending toward both sides in the Y-axis direction from a tip part of the coupling arm 454, and the pair of drive arms 458, 459 are the vibrating arms extending toward the both sides in the Y-axis direction from a tip part of the coupling arm 455.

Further, the electrodes include drive signal electrode 483, drive ground electrodes 484, first detection signal electrodes 485, first detection ground electrodes 486, second detection signal electrodes 487, and second detection ground electrodes 488.

The drive signal electrodes 483 are disposed on the both side surfaces of each of the drive arms 456, 457, and the upper surface and the lower surface of each of the drive arms 458, 459. Meanwhile, the drive ground electrodes 484 are disposed on the upper surface and the lower surface of each of the drive arms 456, 457, and the both side surfaces of each of the drive arms 458, 459.

Further, the first detection signal electrodes 485 are disposed on the upper surface and the lower surface of the detection arm 452, and the first detection ground electrodes 486 are disposed on the both side surfaces of the detection arm 452. Meanwhile, the second detection signal electrodes 487 are disposed on the upper surface and the lower surface of the detection arm 453, and the second detection ground electrodes 488 are disposed on the both side surfaces of the detection arm 453.

Further, the weight 46 is provided to the tip part of each of the drive arms 456, 457, 458, and 459 and the detection arms 452, 453. Further, each of the weights 46 has substantially the same configuration as in the first embodiment described above, and has the thick film part 462, the thin film part 463, and the connection part 464.

Such a vibrator element 4 detects the angular velocity $\omega z$ in the following manner. First, when applying a drive signal between the drive signal electrodes 483 and the drive ground electrodes 484, the drive arms 456 through 459 flexurally vibrate as represented by the arrows shown in FIG. 23. Hereinafter, this drive mode is referred to as a drive vibration mode. Further, when the angular velocity $\omega z$ is applied to the vibrator element 4 in the state of performing driving in the drive vibration mode, a detection vibration mode shown in FIG. 24 is newly excited. In the detection vibration mode, a Coriolis force acts on the drive arms 456 through 459 to excite the vibration in a direction represented by the arrows b, and in concert with this vibration, the detection vibration due to the flexural vibration occurs in a direction represented by the arrows a in the detection arms 452, 453. A charge generated in the detection arm 452 due to such a detection vibration mode is taken out between the first detection signal electrodes 485 and the first detection ground electrodes 486 as a first detection signal, a charge generated in the detection arm 453 is taken out between the second detection signal electrodes 487 and the second detection ground electrodes 488 as a second detection signal, and it is possible to detect the angular velocity $\omega z$ based on these first and second detection signals.

The circuit element 6 includes an interface section for communicating with, for example, an external host device, a drive circuit for driving the vibrator element 4, and a detection circuit for detecting the angular velocity $\omega z$ based on the detection signal from the vibrator element 4.

According also to such a third embodiment as described hereinabove, substantially the same advantages as in the first embodiment described above can be exerted. It should be noted that although the connection part 464 is provided to all of the six weights 46 in the present embodiment, this is not a limitation, but it is sufficient to provide the connection part 464 to at least one weight 46.

Although the vibrator device and the vibrator device according to the present disclosure are hereinabove described based on the illustrated embodiments, the present disclosure is not limited to these embodiments, but the configuration of each of the components can be replaced with one having substantially the same function and an arbitrary configuration. Further, the present disclosure can also be added with any other constituents. Further, it is also possible to arbitrarily combine any of the embodiments with each other.

What is claimed is:

1. A vibrating element comprising:
a base part;
a vibrating arm extending from the base part; and
a weight provided to the vibrating arm, wherein
the weight includes
a thick film part,
a thin film part thinner in film thickness than the thick film part, and
a connection part which is located between the thick film part and the thin film part to connect the thick film part and the thin film part to each other, and which forms a taper shape gradually decreasing in film thickness in a direction from the thick film part side toward the thin film part, wherein
a tilt angle of the connection part is equal to or smaller than 60°.

2. The vibrator element according to claim 1, wherein the thin film part and the connection part are each a laser-processed part which is irradiated with a laser beam to be formed as a thin film.

3. The vibrator element according to claim 2, wherein the thin film part is located at a tip side of the vibrating arm with respect to the thick film part.

4. The vibrator element according to claim 1, wherein the tilt angle of the connection part is equal to or larger than 20°.

5. A vibrator device comprising:
the vibrator element according to claim 1.

6. A vibrating element comprising:
a base part;
a vibrating arm extending from the base part; and
a weight provided to the vibrating arm, wherein
the weight includes
a thick film part,
a thin film part thinner in film thickness than the thick film part, and
a connection part which is located between and respectively abuts the thick film part and the thin film part to connect the thick film part and the thin film part to each other, and which forms a taper shape gradually decreasing in film thickness in a direction from the thick film part side toward the thin film part,
wherein the taper shape of the connecting part is a tilted plane which has a constant tilt angle along an entirety of the connecting part from the thick film part to the thin film part in the direction from the thick film part side toward the thin film part.

7. The vibrator element according to claim 6, wherein the thin film part and the connection part are each a laser-processed part which is irradiated with a laser beam to be formed as a thin film.

8. The vibrator element according to claim 7, wherein the thin film part is located at a tip side of the vibrating arm with respect to the thick film part.

9. The vibrator element according to claim 6, wherein a tilt angle of the connection part is equal to or smaller than 60°.

10. The vibrator element according to claim 6, wherein a tilt angle of the connection part is equal to or larger than 20°.

11. A vibrator device comprising:
the vibrator element according to claim 6.

* * * * *